(12) United States Patent
Hsu et al.

(10) Patent No.: US 11,126,077 B2
(45) Date of Patent: Sep. 21, 2021

(54) PATTERNING DEVICE, A METHOD OF MAKING THE SAME, AND A PATTERNING DEVICE DESIGN METHOD

(71) Applicant: ASML NETHERLANDS B.V., Veldhoven (NL)

(72) Inventors: Duan-Fu Stephen Hsu, Fremont, CA (US); Jingjing Liu, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 128 days.

(21) Appl. No.: 16/485,181

(22) PCT Filed: Feb. 20, 2018

(86) PCT No.: PCT/EP2018/054175
§ 371 (c)(1),
(2) Date: Aug. 12, 2019

(87) PCT Pub. No.: WO2018/153872
PCT Pub. Date: Aug. 30, 2018

(65) Prior Publication Data
US 2020/0041891 A1    Feb. 6, 2020

Related U.S. Application Data

(60) Provisional application No. 62/463,669, filed on Feb. 26, 2017, provisional application No. 62/463,619, filed on Feb. 25, 2017.

(51) Int. Cl.
*G03F 1/36* (2012.01)
(52) U.S. Cl.
CPC ..................... *G03F 1/36* (2013.01)
(58) Field of Classification Search
CPC ........................................ G03F 1/36
USPC .................................................. 430/5
See application file for complete search history.

(56) References Cited

U.S. PATENT DOCUMENTS

| 2016/0011501 A1 | 1/2016 | Huang et al. |
| 2016/0195812 A1 | 7/2016 | Huang et al. |

FOREIGN PATENT DOCUMENTS

| KR | 1020160007331 | 1/2016 |
| TW | 201327026 | 7/2013 |
| WO | 2016050584 | 4/2016 |

OTHER PUBLICATIONS

Korean Office Action issued in corresponding Korean Patent Application No. 10-2019-7027949, dated Sep. 28, 2020.
International Search Report and Written Opinion issued in corresponding PCT Patent Application No. PCT/EP2018/054175, dated May 30, 2018.
Taiwanese Office Action issued in corresponding Taiwanese Patent Application No. 107106071, dated Feb. 26, 2019.

*Primary Examiner* — Christopher G Young
(74) *Attorney, Agent, or Firm* — Pillsbury Winthrop Shaw Pittman LLP

(57) ABSTRACT

A patterning device, includes: an absorber layer on a patterning device substrate; and a reflective or transmissive layer on the patterning device substrate, wherein the absorber layer and the reflective or transmissive layer together define a pattern layout having a main feature and an attenuated sub-resolution assist feature paired with the main feature, wherein: the main feature is configured to generate, upon transferring the device pattern to a layer of patterning material on a substrate, the main feature in the layer of patterning material, and upon the transferring the pattern to the layer of patterning material, the attenuated sub-resolution assist feature is configured to avoid generating a feature in the layer of patterning material and to produce a different radiation intensity than the main feature.

19 Claims, 14 Drawing Sheets

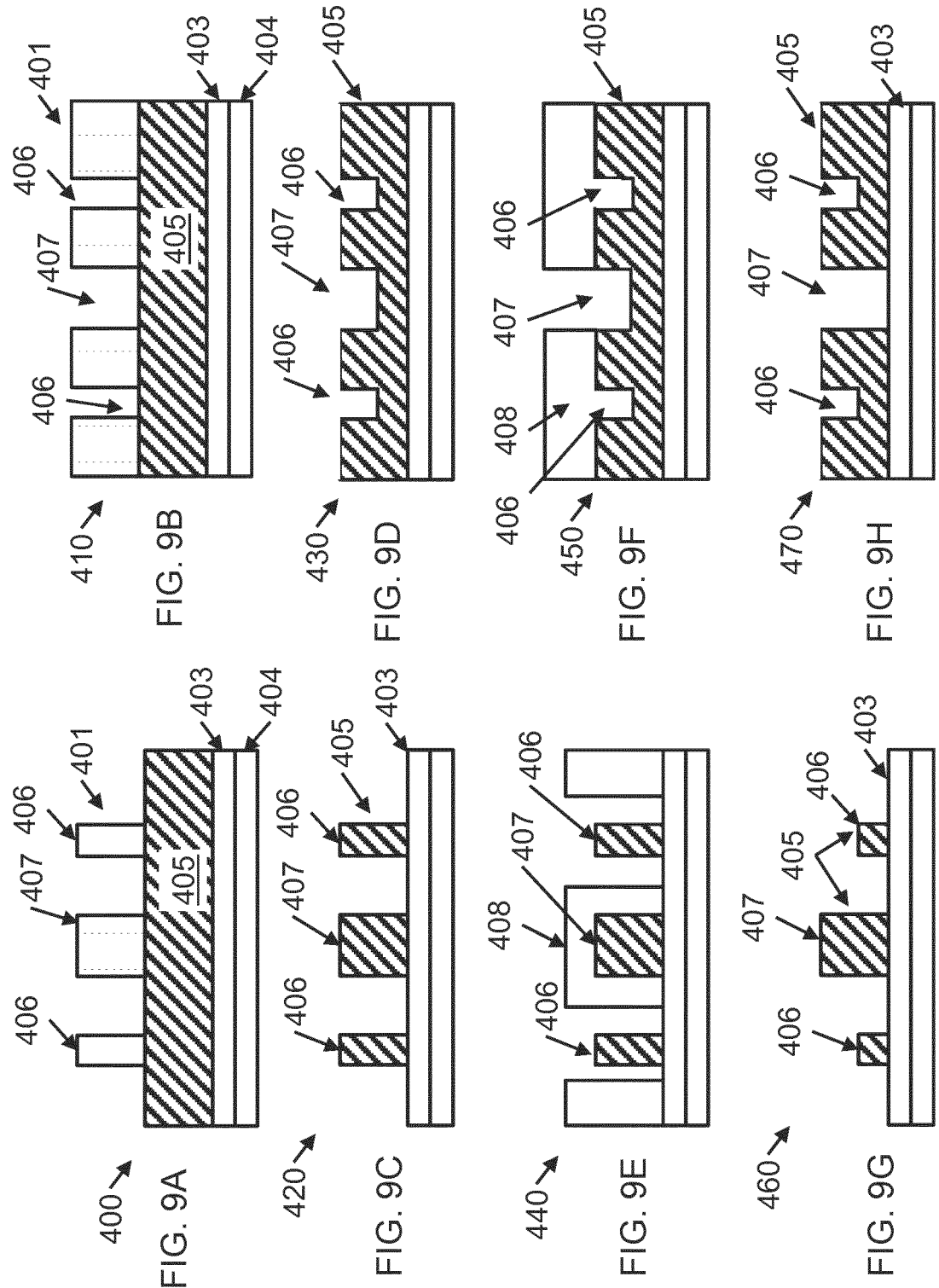

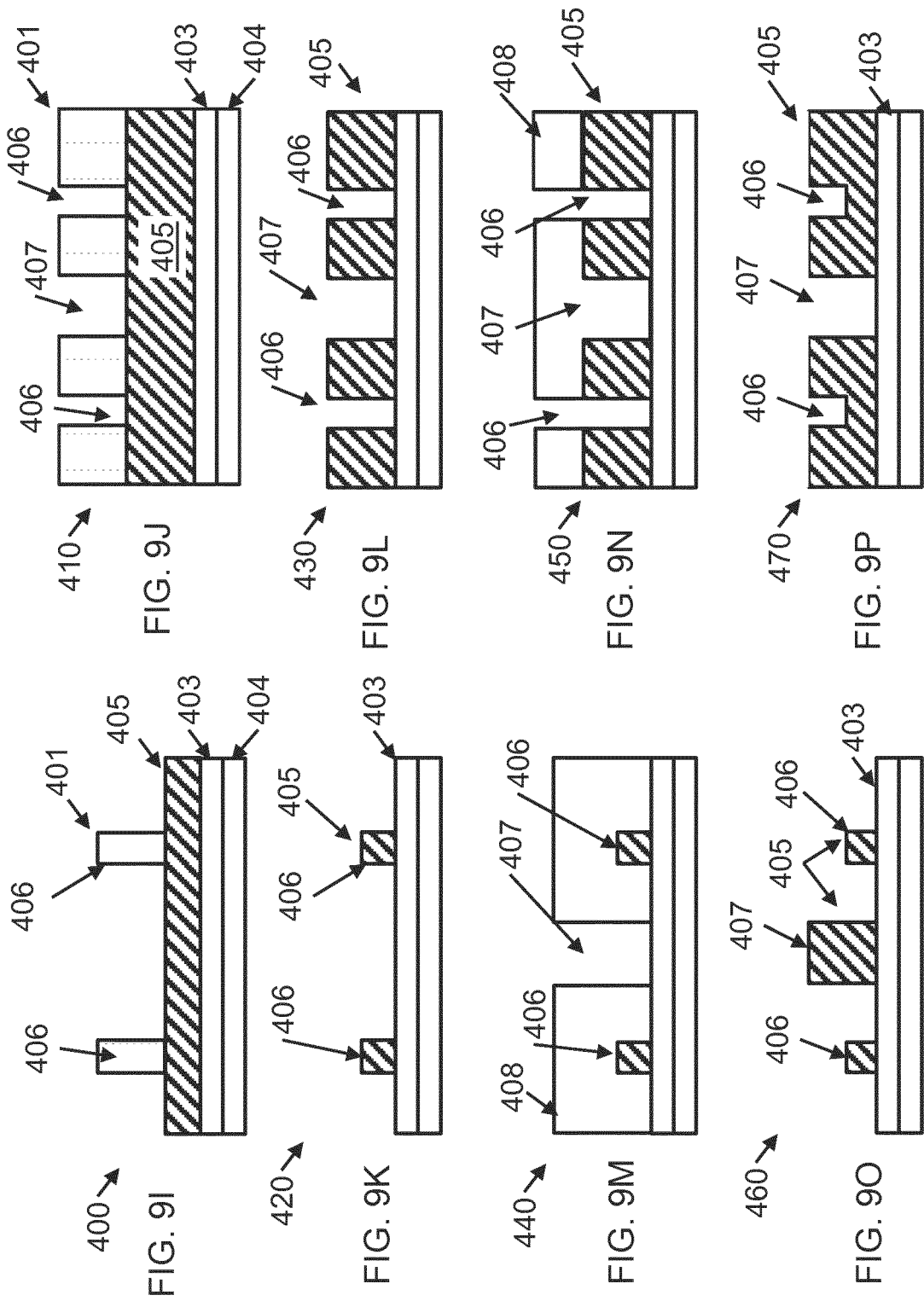

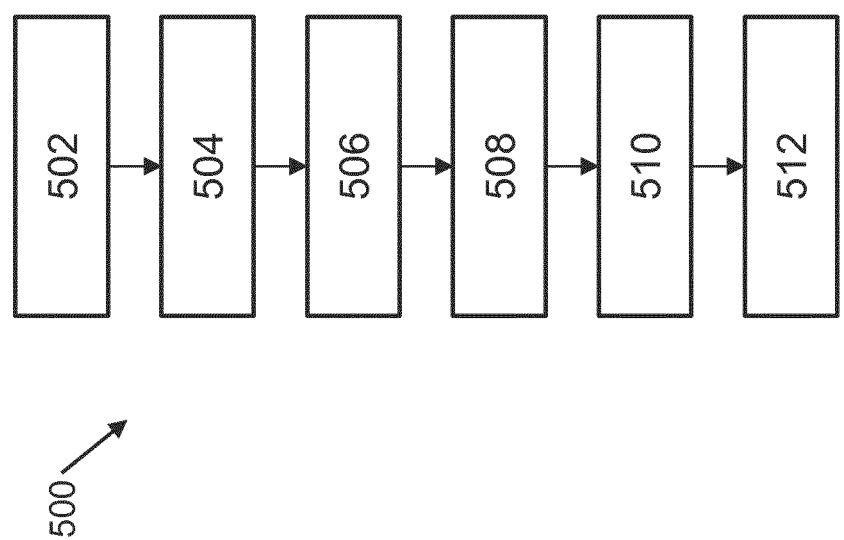

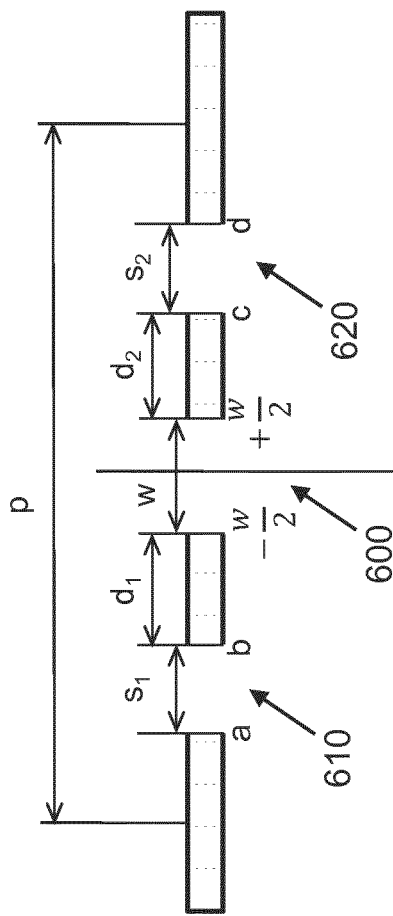
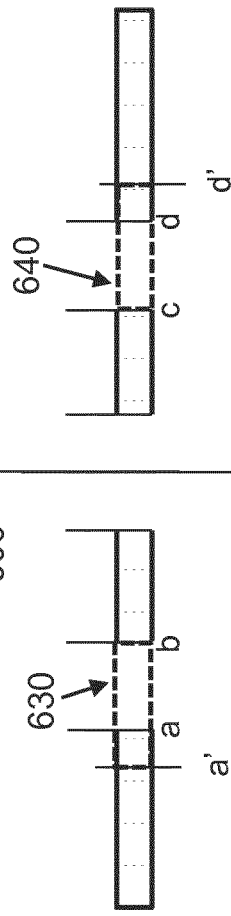
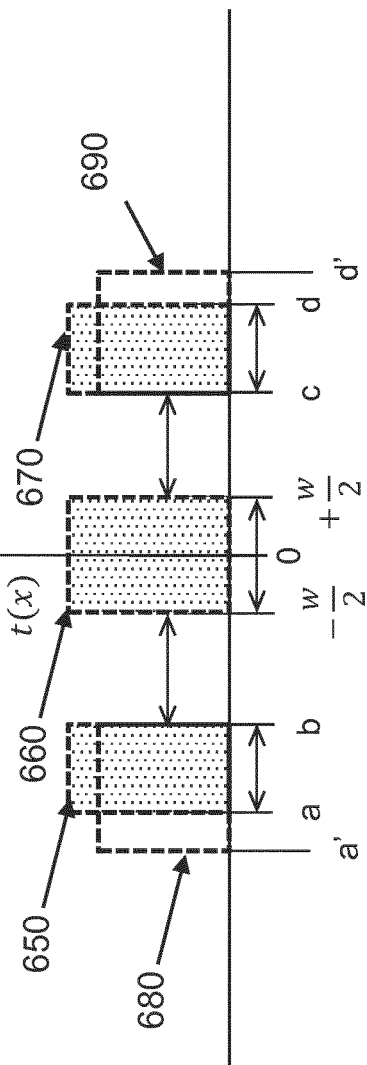

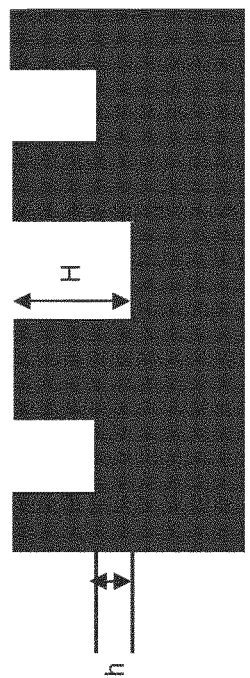
FIG. 12A
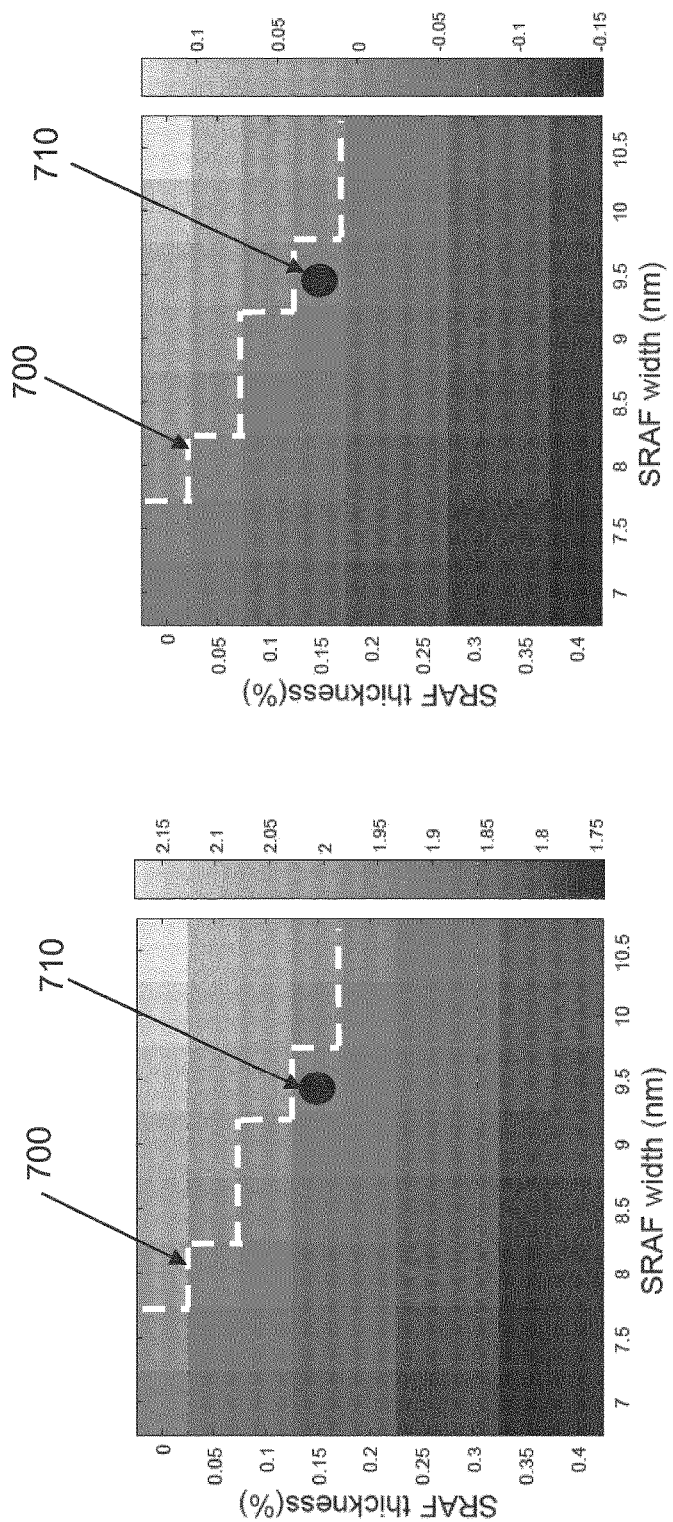
FIG. 12B
FIG. 12C

# PATTERNING DEVICE, A METHOD OF MAKING THE SAME, AND A PATTERNING DEVICE DESIGN METHOD

CROSS-REFERENCE TO RELATED APPLICATIONS

This application is the U.S. national phase entry of PCT Patent Application No. PCT/EP2018/054175, filed on Feb. 20, 2018, which is based upon and claims the benefit of priority of U.S. Provisional Application No. 62/463,619, which was filed on Feb. 25, 2017, entitled "Patterning Device, a Method of Making the Same, and a Patterning Device Design Method," and also claims the benefit of priority of U.S. Provisional Application No. 62/463,669, which was filed on Feb. 26, 2017, entitled "Patterning Device, a Method of Making the Same, and a Patterning Device Design Method," both of which are incorporated herein in their entirety by reference.

TECHNICAL FIELD

The present disclosure relates generally to device manufacturing and methods of printing patterns in device manufacturing processes.

BACKGROUND

A lithography apparatus is a machine that applies a desired pattern onto a target portion of a substrate. Lithography apparatus can be used, for example, in the manufacture of integrated circuits (ICs). In that circumstance, a patterning device, which is alternatively referred to as a mask or a reticle, may be used to generate a pattern corresponding to an individual layer of the IC, and this pattern can be imaged onto a target portion (e.g. comprising part of, one or several dies) on a substrate (e.g. a silicon wafer) that has a layer of radiation-sensitive material (resist such as photoresist). In general, a single substrate will contain a network of adjacent target portions that are successively exposed. Known lithography apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc. While the term substrate encompasses an underlying base (e.g., silicon), it can also, where applicable, encompass one or more layers overlying the base. Thus, transferring a pattern into or onto the substrate can include transfer of the pattern onto one or more layers on the substrate.

Thus, manufacturing devices, such as semiconductor devices, typically involves processing a substrate (e.g., a semiconductor wafer) using a number of fabrication processes to form various features and multiple layers of the devices. Such layers and features are typically manufactured and processed using, e.g., deposition, lithography, etch, chemical-mechanical polishing, and ion implantation. Multiple devices may be fabricated on a plurality of dies on a substrate and then separated into individual devices. This device manufacturing process may be considered a patterning process. A patterning process involves a patterning step, such as optical and/or nanoimprint lithography using a patterning device in a lithographic apparatus, to transfer a pattern on the patterning device to a substrate and typically, but optionally, involves one or more related pattern processing steps, such as resist development by a development apparatus, baking of the substrate using a bake tool, etching using the pattern using an etch apparatus, etc.

SUMMARY

Extreme ultraviolet (EUV) lithography is being adopted in semiconductor manufacturing processes to print smaller features than can be achieved with single-patterning immersion lithography. As the wavelength of radiation used to print device patterns on a semiconductor substrate decreases, the width of a sub-resolution assist feature (SRAF) also reduces in order to maintain the "sub resolution" nature of the assist feature. The short wavelength of EUV lithography results in SRAF widths that are below the mask-writing resolution of present mask-making techniques.

In an embodiment, there is provided a reflective patterning device that includes an absorber layer and a reflective layer, wherein the absorber layer and the reflective layer together define a device pattern layout comprising an attenuated sub-resolution assist feature (attenuated SRAF).

In an embodiment, there is provided a patterning device, comprising: an absorber layer on a patterning device substrate; and a reflective or transmissive layer on the patterning device substrate, wherein the absorber layer and the reflective or transmissive layer together define a pattern layout having a main feature and an attenuated sub-resolution assist feature (attenuated SRAF) paired with the main feature, wherein: the main feature is configured to generate, upon transferring the device pattern to a layer of patterning material on a substrate, the main feature in the layer of patterning material, and upon the transferring the pattern to the layer of patterning material, the attenuated SRAF is configured to avoid generating a feature in the layer of patterning material and to produce a different radiation intensity than the main feature.

In an embodiment, there is provided a patterning device, comprising: a patterning device substrate; and a patterning layer on the substrate, wherein: a first portion of the patterning layer has a first level of reflectance, absorbance or transmission, a second portion of the patterning layer has a second level of reflectance, absorbance or transmission different than the first level of reflectance, absorbance or transmission, and a third portion of the patterning layer has a third level of reflectance, absorbance or transmission, wherein third level of reflectance, absorbance or transmission is between the first and second levels of reflectance, absorbance or transmission and is part of a sub-resolution assist feature.

In an embodiment, there is provided a method of making a patterning device, the method comprising: removing, from an absorber layer over a patterning device substrate of the patterning device, a portion of absorber material to form a first set of pattern layout features and a second set of pattern layout features; providing a masking material on at least part of the second set of pattern layout features so as to expose the first set of pattern layout features while covering the second set of pattern layout features; and removing at least of part of the absorbing layer for the first set of pattern layout features while the second set of pattern layout features are covered by the masking material.

In an embodiment, there is provided a method of making a patterning device, the method comprising: removing, from an absorber layer over a patterning device substrate of the patterning device, a portion of absorber material to form a set of pattern layout features; providing a masking material on at least part of the set of pattern layout features so as to expose a portion of the patterning device substrate while covering the set of pattern layout features; and adding an absorbing material to the exposed portion of the patterning device substrate while the set of pattern layout features are covered by the masking material.

In an embodiment, there is provided a method comprising: obtaining a matching formulation that matches a maximum aerial image intensity of a first diffraction spectrum associated with a patterning device pattern layout having a clear sub-resolution feature (clear SRAF) with a maximum aerial image intensity of a second diffraction spectrum associated with the patterning device pattern layout modified to have an attenuated sub-resolution feature (attenuated SRAF); and solving, by a hardware computer, the matching formulation to determine a value of a dimension of the attenuated SRAF.

In an embodiment, there is provided a computer program product comprising a computer readable medium having instructions recorded thereon, the instructions when executed by a computer implementing a method as described herein.

These and other features, as well as the methods of operation and functions of the related elements of structure and the combination of parts and economies of manufacture, will become more apparent upon consideration of the following description and the appended claims with reference to the accompanying drawings, all of which form a part of this specification. It is to be expressly understood, however, that the drawings are for the purpose of illustration and description only and are not intended as a definition of the limits of the invention.

BRIEF DESCRIPTION OF THE DRAWINGS

Embodiments of the invention are illustrated by way of example, and not by way of limitation, in the figures of the accompanying drawing and in which like reference numerals refer to similar elements.

FIG. 9A, FIG. 9B, FIG. 9C, FIG. 9D, FIG. 9E, FIG. 9F, FIG. 9G and FIG. 9H schematically depict cross-sectional diagrams of a patterning device during stages of an embodiment of a method of making an attenuated SRAF;

FIG. 9I, FIG. 9J, FIG. 9K, FIG. 9L, FIG. 9M, FIG. 9N, FIG. 9O and FIG. 9P schematically depict cross-sectional diagrams of a patterning device during stages of an embodiment of a method of making an attenuated SRAF;

FIG. 10 depicts a flow diagram of an embodiment of a method of calculating a dimension related to an attenuated SRAF;

FIG. 11A, FIG. 11B and FIG. 11C schematically depict a thin mask representation of a pattern layout and a transmittance thereof;

FIG. 12A depicts a schematic representation of a reflective patterning device to a SRAF absorber thickness parameter;

FIG. 12B depicts a graphical diagram of image log slope (e.g., NILS) as a function of SRAF width and a SRAF absorber thickness parameter;

FIG. 12C depicts a graphical diagram of side lobe printing as a function of SRAF width and the SRAF absorber thickness parameter.

DETAILED DESCRIPTION

Figure 1:
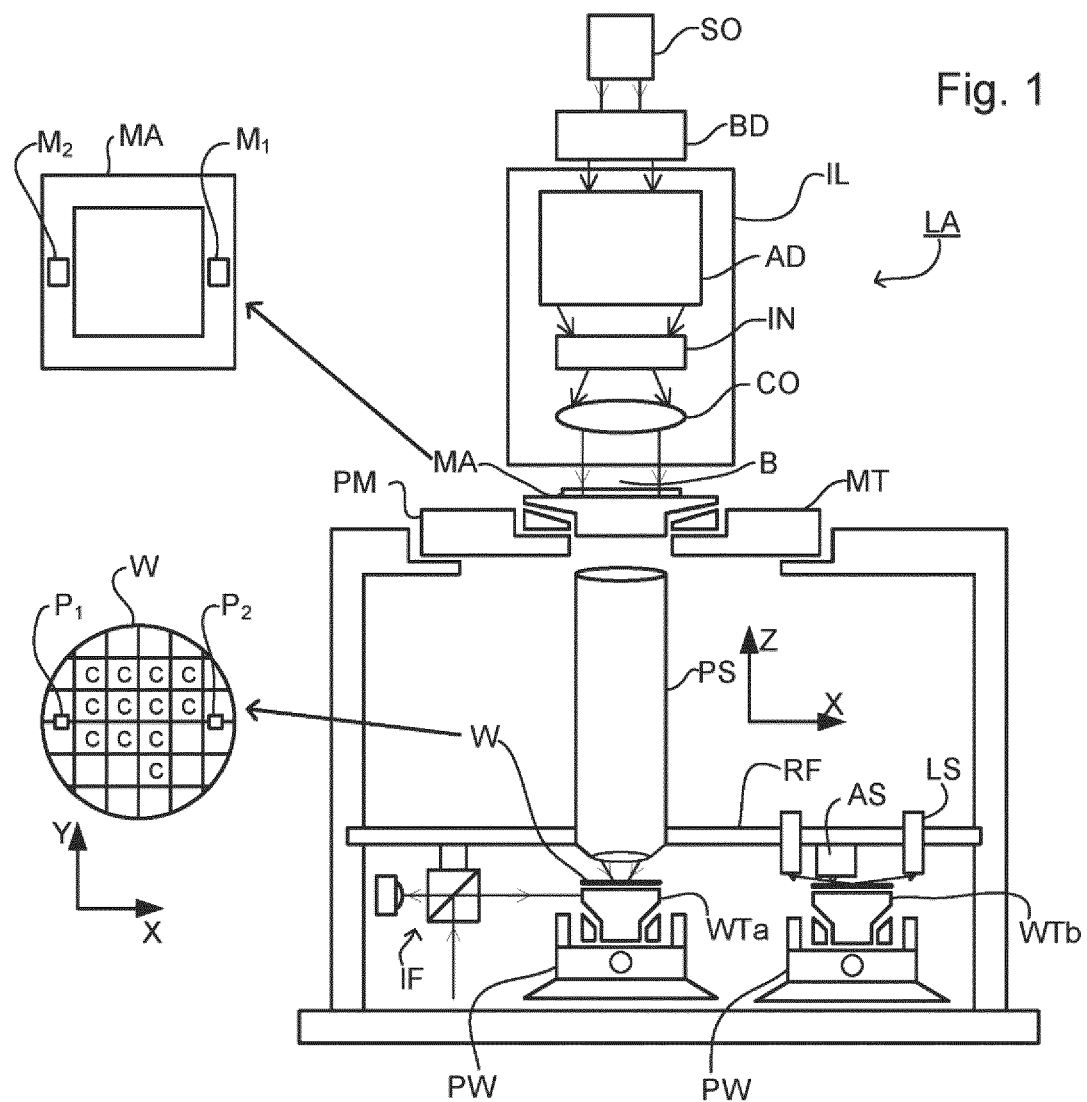
FIG. 1 depicts a schematic diagram of an embodiment of a lithographic apparatus.

FIG. 1 schematically depicts a lithographic apparatus LA in association with which the techniques described herein can be utilized. The apparatus includes an illumination optical system (illuminator) IL configured to condition a radiation beam B (e.g., ultraviolet (UV), deep ultraviolet (DUV) or extreme ultraviolet (EUV) radiation), a patterning device support or support structure (e.g., a mask table) MT constructed to support a patterning device (e.g., a mask) MA and connected to a first positioner PM configured to accurately position the patterning device in accordance with certain parameters; one or more substrate tables (e.g., a wafer table) WTa, WTb constructed to hold a substrate (e.g., a resist coated wafer) W and connected to a second positioner PW configured to accurately position the substrate in accordance with certain parameters; and a projection optical system (e.g., a refractive, reflective, catoptric or catadioptric optical system) PS configured to project a pattern imparted to the radiation beam B by patterning device MA onto a target portion C (e.g., including one or more dies) of the substrate W.

The illumination optical system may include various types of optical components, such as refractive, reflective, magnetic, electromagnetic, electrostatic or other types of optical components, or any combination thereof, for directing, shaping, or controlling radiation. In this particular case, the illumination system also comprises a radiation source SO.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix. As another example the patterning device comprises a LCD matrix.

As here depicted, the apparatus is of a transmissive type (e.g., employing a transmissive patterning device). However, the apparatus may be of a reflective type (e.g., employing a programmable mirror array of a type as referred to above, or employing a reflective mask (e.g., for an EUV system)).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO (e.g., a mercury lamp or excimer laser, LPP (laser produced plasma) EUV source). The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the spatial and/or angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table) MT, and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the patterning device alignment marks may be located between the dies. Small alignment markers may also be included within dies, in amongst the device features, in which case it is desirable that the markers be as small as possible and not require any different imaging or process conditions than adjacent features. The alignment system, which detects the alignment markers, is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS, measuring the position of alignment markers on the substrate using an alignment sensor AS, performing any other type of metrology or inspection, etc. This enables a substantial increase in the throughput of the apparatus. More generally, the lithography apparatus may be of a type having two or more tables (e.g., two or more substrate tables, a substrate table and a measurement table, two or more patterning device tables, etc.). In such "multiple stage" devices a plurality of the multiple tables may be used in parallel, or preparatory steps may be carried out on one or more tables while one or more other tables are being used for exposures.

While a level sensor LS and an alignment sensor AS are shown adjacent substrate table WTb, it will be appreciated that, additionally or alternatively, a level sensor LS and an alignment sensor AS can be provided adjacent the projection system PS to measure in relation to substrate table WTa.

The depicted apparatus can be used in a variety of modes, including for example a step mode or a scan mode.

Figure 2:
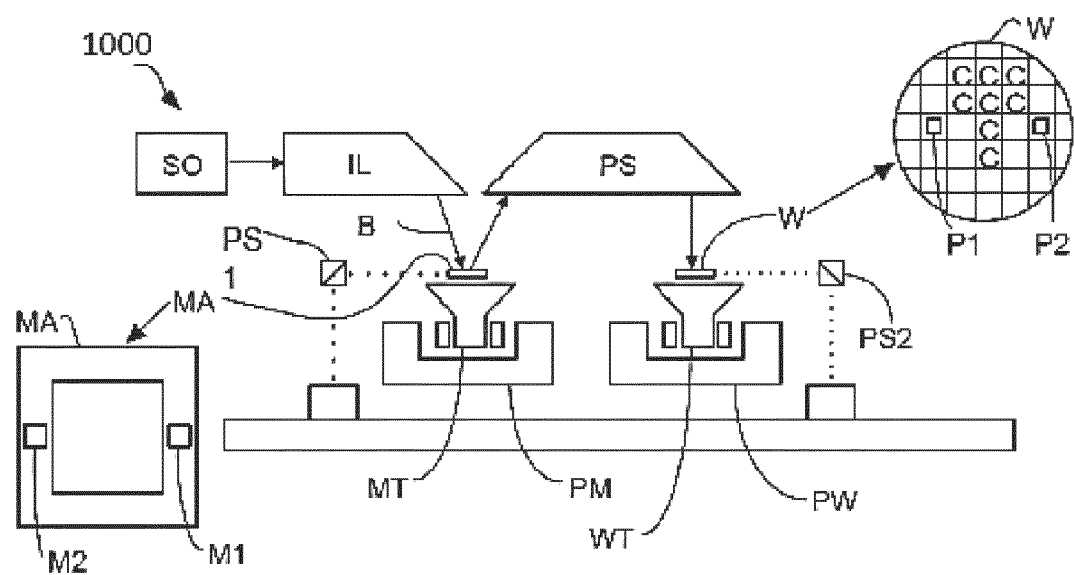
FIG. 2 is a schematic diagram of another lithographic projection apparatus.

FIG. 2 schematically depicts another exemplary lithographic projection apparatus 1000 that can be utilized with the techniques described herein. The lithographic projection apparatus 1000 comprises:

a source collector module SO an illumination system (illuminator) IL configured to condition a radiation beam B (e.g. EUV radiation).

a support structure (e.g. a patterning device table) MT constructed to support a patterning device (e.g. a mask or a reticle) MA and connected to a first positioner PM configured to accurately position the patterning device;

a substrate table (e.g. a wafer table) WT constructed to hold a substrate (e.g. a resist coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

As here depicted, the apparatus 1000 is of a reflective type (e.g. employing a reflective patterning device). It is to be noted that because most materials are absorptive within the EUV wavelength range, the patterning device may have multilayer reflectors comprising, for example, a multi-stack of molybdenum and silicon. In one example, the multi-stack reflector has a 40 layer pairs of molybdenum and silicon where, e.g., the thickness of each layer is less than or equal to (e.g., less than or equal to quarter) the wavelength. Even smaller wavelengths may be produced with X-ray lithography. Since most material is absorptive at EUV and x-ray wavelengths, a thin piece of patterned absorbing material on the patterning device topography (e.g., a TaN absorber on top of the multi-layer reflector) defines where features would print (positive resist) or not print (negative resist).

Referring to FIG. 2, the illuminator IL receives an extreme ultra violet radiation beam from the source collector module SO. Methods to produce EUV radiation include, but are not necessarily limited to, converting a material into a plasma state that has at least one element, e.g., xenon, lithium or tin, with one or more emission lines in the EUV range. In one such method, often termed laser produced plasma ("LPP") the plasma can be produced by irradiating a fuel, such as a droplet, stream or cluster of material having the line-emitting element, with a laser beam. The source collector module SO may be part of an EUV radiation system including a laser, not shown in FIG. 2, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross section.

The radiation beam B is incident on the patterning device (e.g., mask) MA, which is held on the support structure (e.g., patterning device table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using patterning device alignment marks M1, M2 and substrate alignment marks P1, P2.

The depicted apparatus 1000 could be used in at least one of the following modes:

1. In step mode, the support structure (e.g. patterning device table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. patterning device table) MT and the substrate table WT are scanned synchronously while a pattern imparted to the radiation beam is projected onto a target portion C (i.e. a single dynamic exposure). The velocity and direction of the substrate table WT relative to the support structure (e.g. patterning device table) MT may be determined by the (de-) magnification and image reversal characteristics of the projection system PS.

3. In another mode, the support structure (e.g. patterning device table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Figure 3:
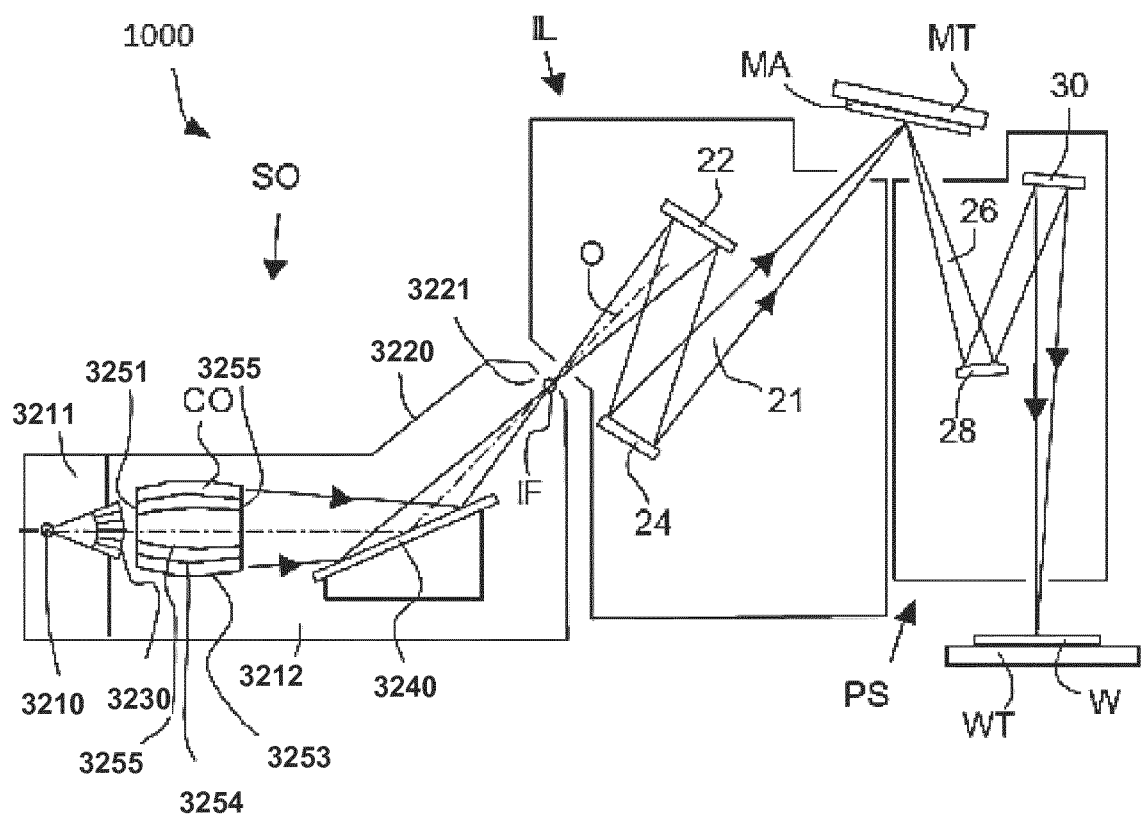
FIG. 3 is a more detailed view of the apparatus in FIG. 2.

FIG. 3 shows the apparatus 1000 in more detail, including the source collector module SO, the illumination system IL, and the projection system PS. The source collector module SO is constructed and arranged such that a vacuum environment can be maintained in an enclosing structure 3220 of the source collector module SO. An EUV radiation emitting plasma 3210 may be formed by a discharge produced plasma source. EUV radiation may be produced by a gas or vapor, for example Xe gas, Li vapor or Sn vapor in which the very hot plasma 3210 is created to emit radiation in the EUV range of the electromagnetic spectrum. The very hot plasma 3210 is created by, for example, an electrical discharge causing at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 3210 is passed from a source chamber 3211 into a collector chamber 3212 via an optional gas barrier or contaminant trap 3230 (in some cases also referred to as contaminant barrier or foil trap) which is positioned in or behind an opening in source chamber 3211. The contaminant trap 3230 may include a channel structure. Contamination trap 3230 may also include a gas barrier or a combination of a gas barrier and a channel structure. The contaminant trap or contaminant barrier 3230 further indicated herein at least includes a channel structure, as known in the art.

The collector chamber 3211 may include a radiation collector CO which may be a so-called grazing incidence collector. Radiation collector CO has an upstream radiation collector side 3251 and a downstream radiation collector side 3252. Radiation that traverses collector CO can be reflected off a grating spectral filter 3240 to be focused in a virtual source point IF along the optical axis indicated by the dot-dashed line 'O'. The virtual source point IF is commonly referred to as the intermediate focus, and the source collector module is arranged such that the intermediate focus IF is located at or near an opening 3221 in the enclosing structure 3220. The virtual source point IF is an image of the radiation emitting plasma 3210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the substrate table WT.

More elements than shown may generally be present in illumination optics unit IL and projection system PS. The grating spectral filter 3240 may optionally be present, depending upon the type of lithographic apparatus. Further, there may be more mirrors present than those shown in the figures, for example there may be 1-6 additional reflective elements present in the projection system PS than shown in FIG. 3.

Collector optic CO, as illustrated in FIG. 3, is depicted as a nested collector with grazing incidence reflectors 3253, 3254 and 3255, just as an example of a collector (or collector mirror). The grazing incidence reflectors 3253, 3254 and 3255 are disposed axially symmetric around the optical axis O and a collector optic CO of this type may be used in combination with a discharge produced plasma source, often called a DPP source.

Figure 4:
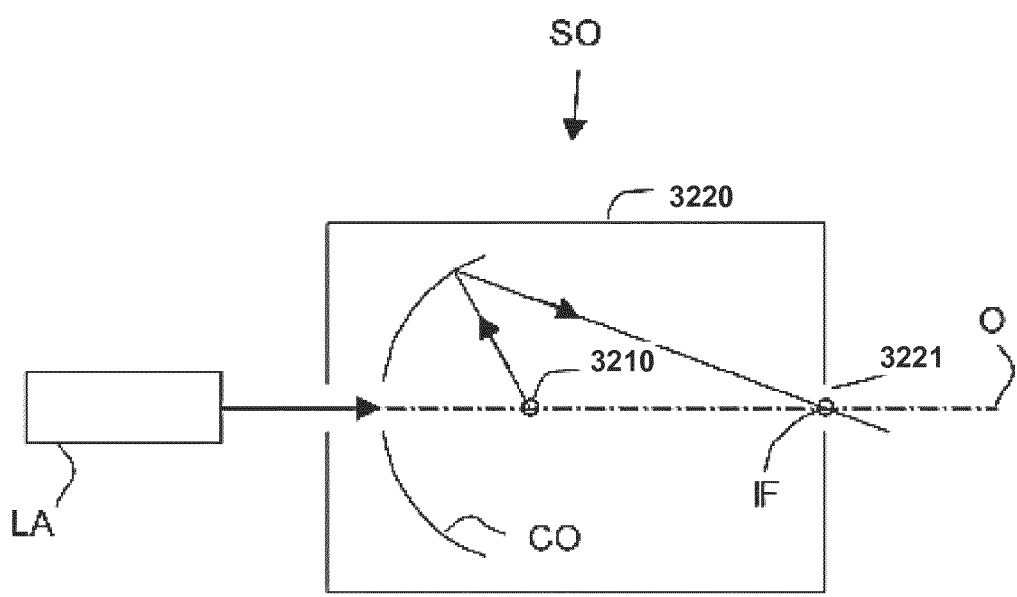
FIG. 4 is a more detailed view of the source collector module SO of the apparatus of FIGS. 2 and 3.

Alternatively, the source collector module SO may be part of an LPP radiation system as shown in FIG. 4. A laser LA is arranged to deposit laser energy into a fuel, such as xenon (Xe), tin (Sn) or lithium (Li), creating the highly ionized plasma 3210 with electron temperatures of several 10's of eV. The energetic radiation generated during de-excitation and recombination of these ions is emitted from the plasma, collected by a near normal incidence collector optic CO and focused onto the opening 3221 in the enclosing structure 3220.

Figure 5:
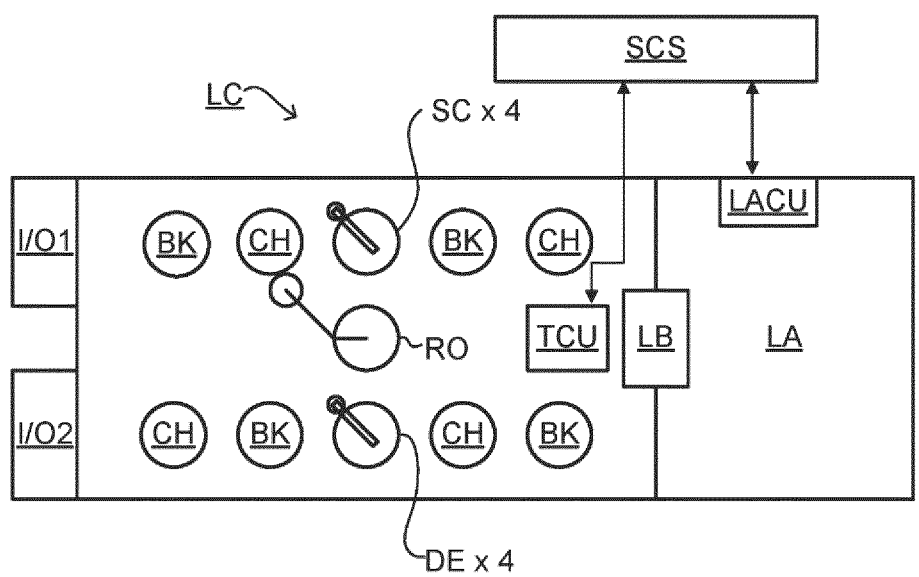
FIG. 5 depicts a schematic diagram of an embodiment of a lithographic cell.

As shown in FIG. 5, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Extreme ultraviolet (EUV) lithography is being adopted in semiconductor manufacturing processes to print smaller features than can be achieved with single-patterning immersion lithography. As the wavelength of radiation used to print device patterns on a substrate decreases, the depth of focus of the patterning device also decreases. Further, increasing the numerical aperture (NA) of the optics in EUV lithography may result in a reduced depth of focus, reducing the process window for printing features of a device pattern on a device substrate.

So, the inclusion of a sub-resolution assist feature (SRAF) in a patterning device may improve depth of focus of a patterning device in order to increase a manufacturing process window for lithography and to enhance the radiation transmitted through main features of the patterning device. In an embodiment, this SRAF is applied in conjunction with an illumination and pattern device pattern layout optimization (sometimes referred to as source mask optimization (SMO)).

A SRAF may be paired with a main feature of a device pattern layout on a patterning device to enhance the main feature, while being configured to avoid resolving the assist feature in patterning material on a device substrate. A SRAF may be desirable in some embodiments of a patterning device in order to regulate an optical response of the patterning device, such that the main feature of the patterning device generates a feature in a layer of patterning material on a substrate, and such that the SRAF that is paired with the main feature remains "sub-resolution" and does not print a feature (sometime referred to as a side lobe) next to the main feature in the layer of patterning material on the substrate. Thus, a SRAF is a pattern feature of a device (or other) pattern that interacts with incident radiation on the patterning device but is configured such that the sub-resolution feature effectively doesn't print at the substrate (typically because the intensity produced by the sub-resolution feature is below the intensity threshold of the resist on the substrate).

In an embodiment, a EUV patterning device has a sub-resolution assist feature that is comparable, except in lateral size, in specifications to the main features of a device pattern layout on the patterning device (herein referred to a clear SRAF), for example, the SRAF, like the main feature, extends through a layer of absorber material to expose a layer of reflective material between the layer of absorber material and the patterning device substrate (sometimes referred to as a dark field patterning device) or the SRAF, like the main feature, is an absorber of the same height and material protruding from a reflective material on the patterning device substrate (sometimes referred to as a bright field patterning device).

Now, a width of a SRAF feature scales with the wavelength of the radiation used to perform the lithography process, and with an inverse of the numerical aperture (NA) of the lithography apparatus. So, for decreasing wavelength and/or increasing numerical aperture, the SRAF width should shrink to avoid being printed.

But, as lithography wavelengths shrink and/or the numerical aperture of the lithography apparatus increases, the anticipated width of a clear SRAF for a patterning device may have a dimension that is so small (e.g., 30 nm or less) that, e.g., it is smaller than the optical resolution of a lithography process used to manufacture the patterning device or it is smaller than can be reliably produced (e.g., due to a high aspect ratio of being higher than wide). So, even though a clear SRAF could be able to accommodate the shorter wavelengths of radiation, including EUV radiation used in some embodiments of lithography methods, and/or work with increasing numerical aperture, the dimension of a SRAF could be so narrow that it cannot be currently or reliably manufactured using a lithography process.

So, in an embodiment, there is provided an attenuated SRAF for a reflective patterning device as described in more detail below. The attenuated SRAF may have a larger width than a clear SRAF and have a similar optical response, and so can increase the patterning device manufacturing window. Thus, a reflective patterning device used in a lithography tool may have one or more attenuated SRAFs that are paired with a main feature of the device pattern layout on the patterning device to improve resolution of the main feature on a layer of patterning material. The attenuated SRAF helps circumvent the challenge of patterning device making for extremely small clear SRAFs.

In an embodiment, a third tone for the SRAF is introduced for the patterning device, which third tone is intermediate the absorber tone and the reflective surface tone. In order to keep a same optical response as a clear SRAF, one or more properties, such as the size, of the attenuated SRAF can be customized to compensate the energy loss as radiation passes through an absorber to create the third tone.

In an embodiment, in the case of a dark field patterning device, the attenuated SRAF has an at least partially radiation absorbing material within the recess of the SRAF within an absorber layer that is more radiation absorbing than a material within a recess of a main feature within the absorber layer. In an embodiment, the at least partially absorbing material has a height/thickness less than a height/thickness of absorber material used to define the main feature of the patterning device. In an embodiment, the at least partially absorbing material has a height/thickness higher than a height/thickness of absorber material, if any, used in a main feature of the patterning device. In an embodiment, the at least partially absorbing material is the substantially same material as that of the absorber layer. In an embodiment, the at least partially absorbing material is a different material than that of the absorber layer.

In an embodiment, in the case of a bright field patterning device, the attenuated SRAF has a different height/thickness and/or has a different material composition, than a main feature. In an embodiment, the attenuated SRAF has smaller height/thickness than a main feature.

In an embodiment, an attenuated SRAF has a larger width than a comparable clear SRAF with a comparable performance for a particular patterning process using a particular combination of radiation wavelength and numerical aperture. In an embodiment, the attenuated SRAF has a comparable performance for a clear SRAF having a width of less than or equal to 30 nm, less than or equal to 25 nm, less than or equal to 15 nm, less than or equal to 10 nm, less than or equal 5 nm, or less than or equal to 3 nm. In an embodiment, the attenuated SRAF does not print with radiation of 14 nm or less wavelength and a numerical aperture greater than 0.30 and has a width greater than or equal 15 nm, greater than or equal to 20 nm, greater than or equal to 25 or greater than or equal to 30 nm. In an embodiment, for a particular patterning process using a particular combination of radiation wavelength and numerical aperture (e.g., radiation of 14 nm or less wavelength and a numerical aperture greater than 0.30), the attenuated SRAF would not print while a clear SRAF of same width as the attenuated SRAF would print. In an embodiment, the attenuated SRAF would produce a maximum intensity that is within ±2%, within ±5%, within ±10% or within ±15% of the maximum intensity of a comparable clear SRAF. In an embodiment, the attenuated SRAF has a lateral dimension greater than or equal 15 nm, greater than or equal to 20 nm, greater than or equal to 25 or greater than or equal to 30 nm.

Now, before going on to describe embodiments of an attenuated SRAF, it can be observed that a EUV attenuated SRAF works very differently than a DUV attenuated phase shift mask. For DUV, an attenuated phase shift mask is a transmissive mask. The extinction coefficient k and the absorber thickness control the attenuation. The refractive index n controls the phase. So, to achieve a π phase shift, a specific optimum thickness should be chosen. For a EUV patterning device, a reflective layer film thickness variation can change the phase which introduces a placement error. And, for EUV attenuated SRAF, the attenuation is controlled by the absorber extinction coefficient and thickness, which is similar to DUV. But the phase is controlled by the SRAF width and the depth. So, as the EUV radiation propagates through a SRAF trench larger than the EUV wavelength, total internal reflection controls the path of the wave propagation, and therefore determines the phase shift of the SRAF with respect to main feature. Furthermore, for a EUV attenuated SRAF, the absorber refractive index n is very close to vacuum, and the SRAF width increase is moderate. Hence mainly the attenuation effect is considered for a EUV attenuated SRAF.

Figure 6:
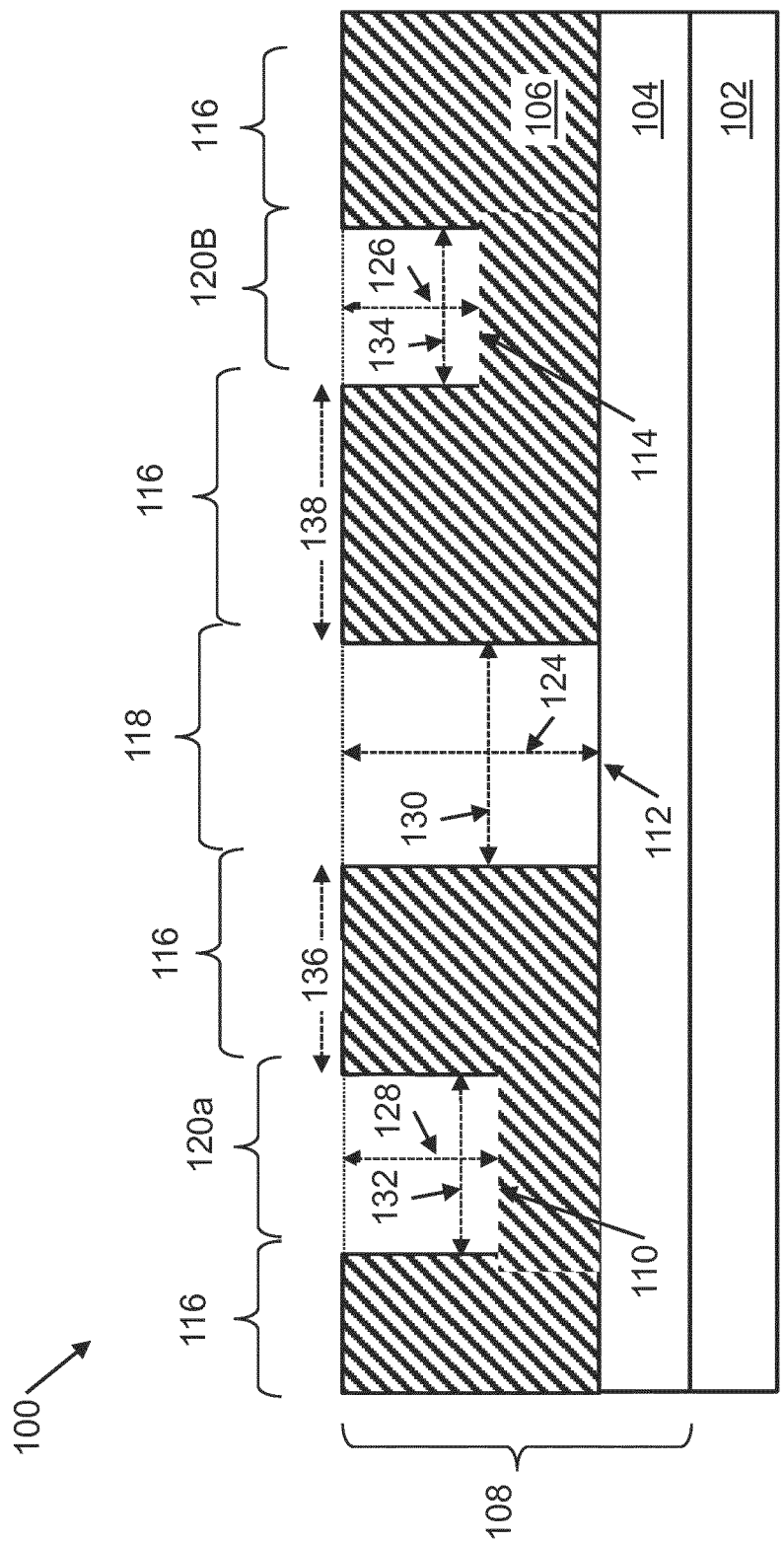
FIG. 6 schematically depicts a cross-sectional view of an embodiment of a patterning device.

FIG. 6 depicts a cross-sectional view of an embodiment of a patterning device 100. In an embodiment, patterning device 100 is a dark field patterning device. Patterning device 100 includes a patterning device substrate 102, on which is located a reflecting layer 104 and an absorber layer 106. Absorber layer 106 and reflecting layer 104 may together form a patterning layer 108 that includes a device pattern layout for a manufacturing process.

In an embodiment, absorber layer includes an attenuated SRAF 110, a main feature 112, and a further attenuated SRAF 114. Attenuated SRAF 110 and further attenuated SRAF 114 are configured to modify an optical response of radiation incident on the attenuated SRAFs, but not to resolve as features in a layer of patterning material on a device substrate.

Absorber layer includes a first region 116 with a first thickness of absorber material, or a total thickness of the absorber layer, and a second region 118 with a second thickness of absorber material, if any. In an embodiment, main feature 112 may correspond to the second region 118 of a patterning device. In an embodiment, first region 116 may correspond to an unmodified region of an absorber layer.

In an embodiment, the absorber layer includes a third region with a third thickness of absorber material. In an embodiment, the third region may include sub-region 120A, corresponding to attenuated SRAF 110, and sub-region 120B, corresponding to further attenuated SRAF 114.

In an embodiment, absorber layer 106 in the first region 116 may have a thickness of absorber material approximately equal to an initial thickness of absorber material. According to an embodiment, main feature 112 in the second region 118 may have a first absorber thickness of zero or about zero. Depth 124 of main feature 112 in absorber layer 106 may equal the total thickness of absorber layer 106, whereby a layer below absorber layer 106 may be directly exposed to incident radiation striking the patterning device.

According to an embodiment, attenuated SRAF 110 in region 120A may have an attenuated SRAF depth 128 and further attenuated SRAF 114 in region 120B may have a further attenuated SRAF depth 126 below top surface 110 of absorber layer 106. In an embodiment, attenuated SRAF depth 128 and further attenuated SRAF depth 126 are the same depth. In an embodiment, attenuated SRAF depth 128 and further attenuated SRAF depth 126 are different depths.

According to an embodiment, main feature 112 has a main feature width 130, configured to generate a portion of a device pattern in a layer of patterning material on a device substrate during a lithography process. Attenuated SRAF 110 has an attenuated SRAF width 132, and further attenuated SRAF 114 has a further attenuated SRAF width 134. In an embodiment, attenuated SRAF width 132 and further attenuated SRAF width 134 are the same width. In an embodiment, attenuated SRAF width 132 and further attenuated SRAF width 134 are different widths.

In an embodiment, attenuated SRAF 110 is a first distance 136 from main feature 112, and further attenuated SRAF 114 is a second distance 138 from main feature 112. According to an embodiment, first distance 136 and second distance 138 are different dimensions in order to, for example, help correct for a Bossung tilt in a lithography process. In an embodiment, the first distance 136 and the second distance 138 are a same dimension.

While this embodiment has described the absorbing material in attenuated SRAF 110 and further attenuated SRAF 114 as being the same absorber layer as used to create the main feature 112, it need not. The absorbing material in attenuated SRAF 110 and/or further attenuated SRAF 114 may be a different material than absorber layer 106. Further, the heights/thicknesses of attenuated SRAF 110 and/or further attenuated SRAF 114 need not necessarily be less than that of the absorber layer 106 depending on the absorbing material.

Figure 7:
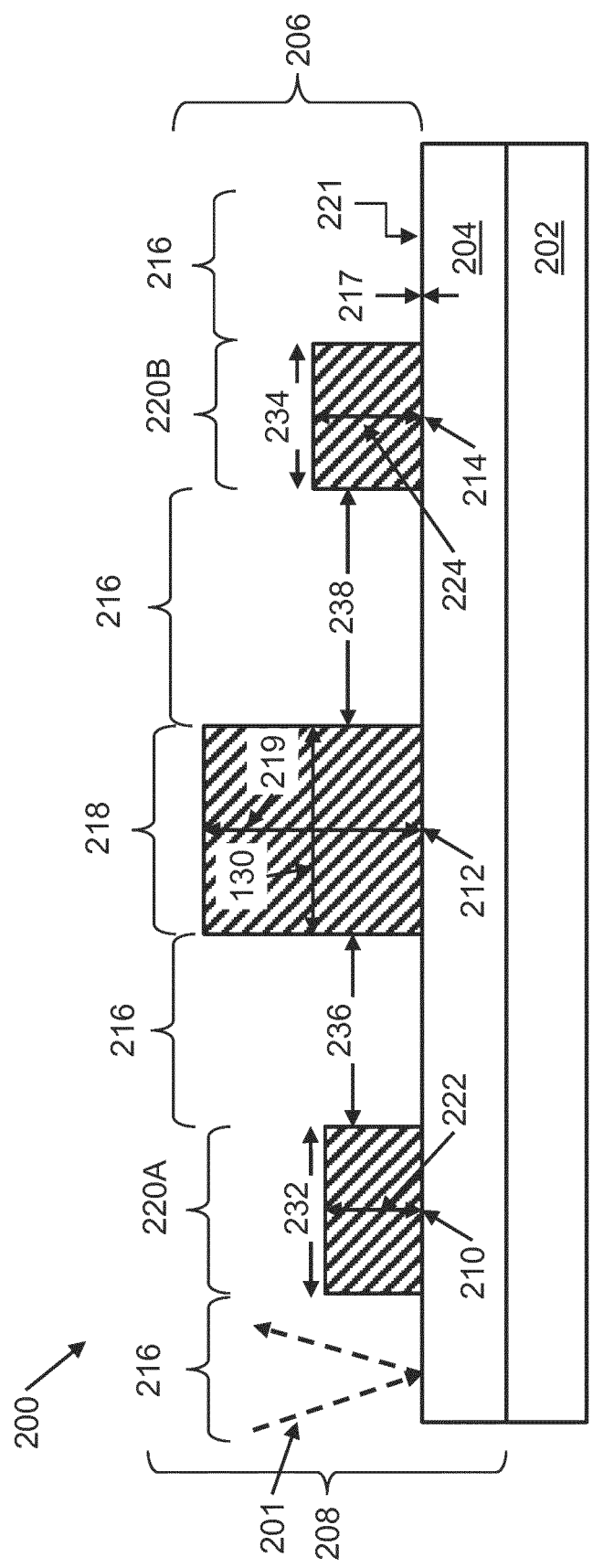
FIG. 7 schematically depicts a cross-sectional view of an embodiment of a patterning device.

FIG. 7 depicts a cross-sectional view of an embodiment of a patterning device 200. In an embodiment, patterning device 200 is a bright field patterning device. Patterning device 200 includes a patterning device substrate 202, on which are located a reflecting layer 204 and an absorber layer 206. Absorber layer 206 and reflecting layer 204 together may form a pattern layer 208 that may generate, on a device substrate, a device pattern during a lithography process.

Absorber layer 206 may include an attenuated SRAF 210, a main feature 212, and a further attenuated SRAF 214. Absorber layer 206 may include a first region 216 with a first thickness 217 of absorber material, where the first thickness 217 of absorber material can be approximately zero. In an embodiment, first region 216 may correspond to an "open" area of the device pattern layout in pattern layer 208. Absorber layer 206 may include a second region 218 with a second thickness 219 of absorber material, and a third region 220A, 220B with absorber material having absorber layer thickness between first thickness 217 and second thickness 219.

In an embodiment, main feature 212 may correspond to the second region 218 of the patterning device such that second thickness 219 is larger than the thickness of absorber material in first region 216 or third region 220A or 220B. In an embodiment, the radiation 201 incident to reflective layer 204 in first region 216 reflects effects unimpeded from the surface 221 of a layer below the absorber layer 206. In an embodiment, the third region may include sub-region 220A, corresponding to attenuated SRAF 210, and/or sub-region 220B, corresponding to further attenuated SRAF 214. Sub-region 220A may have a thickness 222 of absorber material that is smaller than thickness 219 of absorber material in second region 218. Sub-region 220B may have a thickness 224 of absorber material that is smaller than thickness 219 of absorber material in second region 218. In an embodiment, thickness 222 and thickness 224 are a same thickness. In an embodiment, thickness 222 and thickness 224 are different thicknesses.

Attenuated SRAF 210 may have an attenuated SRAF width 232, and further attenuated SRAF 214 may have a further attenuated SRAF width 234. In an embodiment, attenuated SRAF width 232 and further attenuated SRAF width 234 may be the same width. In an embodiment, attenuated SRAF width 232 and further attenuated SRAF width 234 are different widths. In an embodiment, attenuated SRAF 210 is a first distance 236 from main feature 212, and further attenuated SRAF 214 may be a second distance 238 from main feature 212. According to the an embodiment, first distance 236 and second distance 238 are different dimensions in order to, for example, correct for a Bossung tilt in a lithography process. In an embodiment, the first distance 236 and the second distance 238 are a same dimension.

Figure 8:
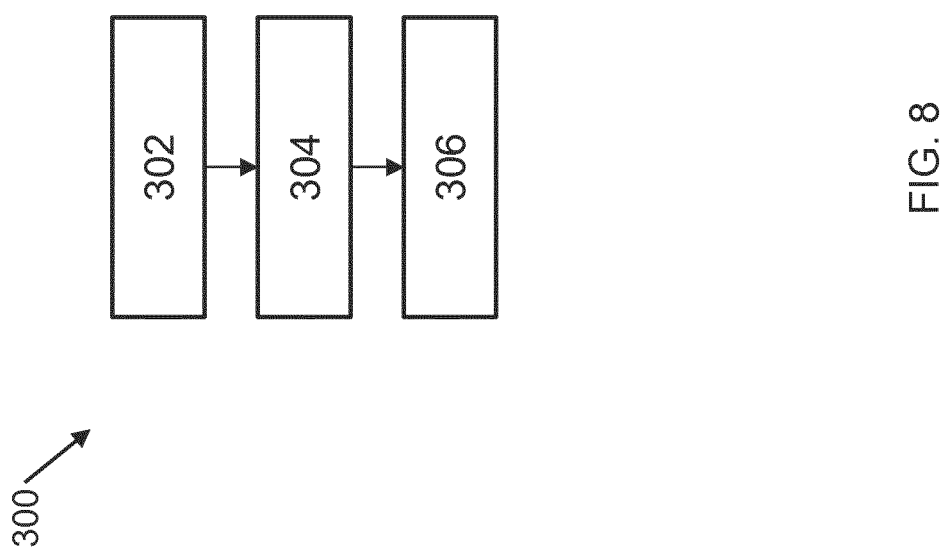
FIG. 8 depicts a flow diagram of an embodiment of a method of making an attenuated SRAF.

FIG. 8 depicts a flow diagram of an embodiment of a method 300 of making an attenuated SRAF. According to an embodiment, method 300 comprises an operation 302, wherein the device pattern layout is at least partly generated in the top portion of an absorber layer on a patterning device substrate. According to an embodiment, when manufacturing a dark field patterning device such as is portrayed in FIGS. 9B, 9D, 9F, and 9H described hereafter, the device pattern layout is generated in an absorber layer such that the pattern layer is mostly absorber layer with one or more portions removed therefrom to expose a reflective layer, the removed portions forming pattern features of the pattern layer. According to an embodiment, when manufacturing a bright field patterning device, such as is portrayed in FIGS. 9A, 9C, 9E and 9G described hereafter, the device pattern layout is generated in a layer of absorber material such that the pattern layer is mostly reflective layer with one or more absorber portions protruding from the reflective layer to form pattern features The pattern layout can be generated by removal of absorber material. The removal can be accomplished by plasma etching, an electron beam process, or some other process of forming a device pattern layout on a surface of a substrate. Removal of absorber layer material during operation 302 may occur in both a first region and a second region of the patterning device. Absorber material in one of a first region or second region of the device pattern may be removed to expose a layer below the layer of absorber material.

Method 300 may also include an operation 304, in which the absorber material is provided with a layer of masking material. In an embodiment, for both bright field and dark field patterning devices, a region of the patterning device has an intermediate thickness of absorber material: a thickness greater than zero, but less than the full thickness of the absorber layer. A layer of patterning material on the layer of partially formed device pattern layout may protect a portion of the absorber layer during removal of some of the absorber material from an exposed portion of the absorber layer.

According to an embodiment, a bright field patterning device subjected to operation 304 may be provided with a patterned layer of masking material so as to mask a first region of absorber material (corresponding to one or main features of the device pattern layout) before an attenuated SRAF is formed by reducing the thickness of the absorber material to an intermediate thickness value, as described above, in the unmasked second region. According to an embodiment, a dark field patterning device subjected to operation 304 may be provided with a patterned layer of masking material so as to mask a first region of absorber material (corresponding to one or more attenuated SRAFs of the device pattern layout) before a main feature is fully formed by reducing the thickness of the absorber material to expose a reflective layer.

Method 300 may also include an operation 306, wherein the masking material may be fully removed.

Thus, for both bright field and dark field patterning devices, the method 300 may generate a three-"tone" patterning device pattern layout: a first "tone" corresponding to an optical response of a region of the patterning device having zero thickness of absorber material, a second "tone" corresponding to an optical response of a region of the patterning device having an intermediate thickness of absorber material, as described above, and a third "tone" corresponding to an optical response of a region of the patterning device having a maximum (e.g., unmodified) thickness of absorber material. Alternatively or in addition to the steps describing an etch process discussed herein, other methods could be used to create the attenuated SRAF patterning device layout, including e-beam tracing, wet chemical etching, sputtering of absorber material from a surface of the patterning device, an additive process (such as an inkjet or 3D printing process), etc.

FIGS. 9A-9H depict schematic cross-sectional diagrams of patterning devices during an example manufacturing flow of a patterning device such as described for FIG. 8 above. FIG. 9A depicts a bright field patterning device 400 during a patterning device manufacturing process. A patterning device substrate 404 has a reflective layer 403 and an absorber layer 405. In an embodiment, a reflective layer 403 may be a multilayer stack of molybdenum and silicon between patterning device substrate 404 and absorber layer 405. The absorber layer 405 may include a metal layer or a metal nitride layer. In an embodiment, the absorber layer 405 may include nickel, chrome, tantalum, aluminum, ruthenium, rhenium, and/or gold. In an embodiment, the absorber layer 405 may be a layer of tantalum boron nitride (TaBN).

A layer of masking material 401 is provided above the absorber layer 405, and has a pattern to at least partly form a device pattern layout. In an embodiment, the masking material 401 comprises resist which can be patterned and developed to form device pattern layout. In an embodiment, masking material 401 is a layer of photoresist capable of undergoing an optical process to receive a pattern to form the device pattern layout for the patterning device.

The masking material 401 comprises a pattern feature corresponding to a main feature 407 of the device pattern layout, and is paired with a pattern feature corresponding to at least one sub-resolution assist feature 406 of the device pattern layout. Main feature 407 may have a greater width than sub-resolution assist feature 406 and be at a different distance from each of a plurality of sub-resolution features.

FIG. 9B depicts a dark field patterning device 410 during a patterning device manufacturing process. A layer of masking material 401 having a pattern for forming the device pattern layout is provided on top of an absorber layer 405. Absorber layer 405 is located above a reflective layer 403 on a patterning device substrate 404. The pattern in patterning material 401 includes pattern features corresponding to a sub-resolution assist feature 406 and a main feature 407 respectively of the device pattern layout of the patterning device.

Subsequent to providing a patterned masking material 401, a pattern transfer process takes place to transfer the pattern from patterning material 401 to absorber layer 405. FIGS. 9C and 9D depict patterning device making stages 420 and 430, respectively, wherein an upper portion of absorber layer 405 receives at least part of the device pattern layout via a material removal process using masking material 401. FIG. 9C depicts patterning device making stage 420, wherein the pattern present in patterning material 401 has been transferred through the entirety of the absorber layer to expose a layer below absorber layer 405. In an embodiment, the layer below absorber layer 405 that is exposed is reflective layer 403. FIG. 9D depicts patterning device making stage 430, wherein a layer below absorber layer 405 is not exposed after the pattern present in patterning material 401 has been transferred to an upper portion of absorber layer 405. In patterning device making stage 430, SRAF 406 and main feature 407 extend partway through absorber layer 405 but do not extend down to a layer below absorber layer 405.

Subsequent to transfer of the pattern into the layer of absorber material 405, absorber layer 405 is provided with another layer of masking material 408 (which may be the same as or different than masking material 401) that has an arrangement to expose a region of absorber layer 405. FIGS. 9E and 9F depict patterning device making stages 440 and 450, respectively. Patterning device making stage 440 in FIG. 9E depicts an embodiment of the patterning device after one or more processing steps consistent with operation 306 are performed thereon, and patterning device making stage 450 in FIG. 9F depicts an embodiment of a patterning device after one or more processing steps consistent with operation 306 are performed thereon. Specifically, patterning device making stage 440 depicts an embodiment where absorber layer 405 is partially covered with patterning material 408 such that main feature 407 is covered and sub-resolution assist feature 406 is exposed. Further, patterning device making stage 450 depicts an embodiment where absorber layer 405 is partially covered with patterning material 408 such that sub-resolution assist feature 406 is covered and main feature 407 is exposed.

FIG. 9G depicts patterning device making stage 460, representative of an embodiment of a patterning device after an absorber layer material removal process is performed to reduce the amount of absorber material present in SRAF 406, while main feature 407 retains an original thickness of absorber material from the embodiment depicted in FIG. 9E. Thus, patterning device 460 has three "tones", or types of optical response for radiation traveling from patterning device 460 to a layer of patterning material: a first optical response is from an open area of reflective layer 403, a second optical response is from main feature 407, and a third optical response is from attenuated SRAF 406 because the optical response is different than that of the "open" areas near the main feature 407 and different from the optical response of the main feature 407 to radiation interacting with the patterning device.

FIG. 9H depicts patterning device making stage 470, representative of an embodiment of a patterning device that has undergone further absorber material removal to expose a portion of a layer below absorber layer 405. Main feature 407 extends through the layer of absorber material 405 to expose a layer beneath absorber material 405. SRAF 406 is an attenuated SRAF because SRAF extends partially through absorber material 405 but does not expose a layer of material below absorber material 405. Thus, the portion of absorber material within SRAF 406 attenuates radiation impinging on the patterning device during a lithography operation and thus providing a different response relative to the optical response of radiation incident to an open area (e.g., an area with unmodified absorber material) or a main feature 407 of the patterning device. Thus, the patterning device is another example of a three tone patterning device having multiple optical responses to radiation that impinges upon and is reflected from the patterning device.

FIG. 9I, FIG. 9J, FIG. 9K, FIG. 9L, FIG. 9M, FIG. 9N, FIG. 9O and FIG. 9P schematically depict cross-sectional diagrams of a patterning device during stages of an embodiment of a method of making an attenuated SRAF. This embodiment is similar to the embodiment of FIGS. 9A-H, except that this embodiment is designed for material addition at stages 440 and 450 in FIGS. 9M and 9N instead of material removal at stages 440 and 450 in FIGS. 9E and 9F. So, to enable this, e.g., the layout of the pattern in masking materials 401 and 408 is different to yield different patterns in absorber material 405 at stages 420 and 430. Moreover, in FIG. 9A, the absorber material 405 is thinner than absorber material 405 in FIG. 9I. Then, at stages 440 and 450 in FIGS. 9M and 9N respectively absorbing material is added by, e.g., deposition (e.g., chemical vapor deposition, physical vapor deposition, etc.). In FIG. 9M, absorbing material is added to form main feature 407 as shown in FIG. 9O. As should be appreciated, the pattern in patterning material 401 can be arranged differently such that main feature 407 is formed at FIG. 9K, but assist features 406 are not yet (or only partially) formed, and then the assist features 406 are formed (or grown) at FIG. 9M. In FIG. 9N, absorbing material is added through the openings in masking material 408 to form the absorbing aspect of assist features 406 as shown in FIG. 9P.

FIG. 10 depicts a flow diagram of an embodiment of a method 500 for calculating a dimension related to an attenuated SRAF. In particular, it is proposed to determine an attenuated SRAF that has at least a different width but essentially the same optical effect as a clear SRAF.

Method 500 comprises an operation 502, wherein a first diffraction spectrum for a patterning device with a device pattern layout having at least one clear sub-resolution attenuation feature (clear SRAF) is formulated. This diffraction spectrum aids in providing a target against which performance of a device pattern layout with one or more attenuated SRAFs can be evaluated as part of ascertaining the parameters (e.g., dimension, absorbance, spacing from a main feature, etc.) of the one or more attenuated SRAFs. Thus, an objective of calculating the diffusion spectrum for one or more clear SRAFs (as well for one or more attenuated SRAFs as discussed hereafter) would be to adjust one or more parameters of the one or more attenuated SRAFs to produce a transmittance (or an optical response) comparable to that of the calculated first diffusion spectrum of a patterning device having one or more clear SRAFs. And so, method 500 comprises an operation 504, wherein a second diffraction spectrum for the patterning device having one or more attenuated SRAFs is formulated.

In an embodiment, to arrive at a modified attenuation and width of the attenuated SRAF, a Fourier analysis is performed on a Kirchoff mask to find the equivalent function to a clear SRAF. A schematic representation of an example basic mask is depicted in FIG. 11.

Referring to FIG. 11A, a schematic thin mask representation of a dark field patterning device is presented. Of course, a bright field patterning could be presented and the appropriate formulations determined therefor.

The basic device pattern layout has a main feature 600 and has clear SRAFs 610, 620 on either side thereof. FIG. 11A further shows various dimensions and specifications which are used calculating the diffusion spectra of the hypothetical patterning device having clear and attenuated SRAFs. For example, FIG. 11A specifies the width $s_1$ of a first clear SRAF 610, the width $s_2$ of a second clear SRAF 620, a distance $d_1$ of the first clear SRAF 610 from a first side of main feature 600, a distance $d_2$ of the second clear SRAF 620 from a second side of main feature 600, and a width w of the main feature 600. As will be appreciated, while the width w will likely remain the same, the other parameters relating to the clear SRAF can be varied to create the attenuated SRAF.

FIG. 11B now schematically shows the creation of attenuated SRAFs 630, 640. In this example, the attenuated SRAF 630 corresponding to the first clear SRAF 610 has an extended width from a to a' and the attenuated SRAF 640 corresponding to the second clear SRAF 620 has an extended width from d to d'. This is shown schematically by the dashed boxes 630, 640. Of course, the width can be changed in a different direction and one or both of distances $d_1$ and $d_2$ can be changed.

Associated with the change in width to form the attenuated SRAFs would be a change in transmittance. FIG. 11C shows the change in transmittance from the SRAFs. Transmittance 660 corresponds to the transmittance of the main feature 600 and remains the same in this example. Transmittance 660 corresponds to the transmittance of the first clear SRAF 610 and transmittance 670 corresponds to the transmittance of the second clear SRAF 620. Transmittance 680 corresponds to the transmittance of the first attenuated SRAF 630 and transmittance 690 corresponds to the transmittance of the second attenuated SRAF 640. As seen, the transmittance distribution would be changed but desirably the same intensity would be produced for the first attenuated SRAF 630 as for the first clear SRAF 610 and the same intensity would be produced for the second attenuated SRAF 640 as for the second clear SRAF 620.

Now, the electrical field of a diffraction pattern $T_M$ for the clear SRAFs above may be calculated using equation (1), below:

$$T_m = \frac{\sin \pi w f_x}{\pi f_x} + \frac{1}{\pi f_x}[\cos \pi f_x \Delta d_1 \sin \pi f_x s_1 + \cos \pi f_x \Delta d_2 \sin \pi f_x s_2] - \quad (1)$$

-continued $$\frac{i}{\pi f_x}[\sin \pi f_x \Delta d_1 \sin \pi f_x s_1 + \sin \pi f_x \Delta d_2 \sin \pi f_x s^2]$$

wherein, referring to FIG. 11, $s_1=b-a$, $s_2=d-c$, $\Delta d_1=b+a$, and $\Delta d_2=d+c$.

The electric field of the diffraction pattern $T_m'$ for the corresponding attenuated SRAFs may be described as:

$$T_m' = \frac{\sin \pi w f_x}{\pi f_x} + \frac{1}{\pi f_x}[t_1 \cos \pi f_x(\Delta d_1 - \Delta s_1)\sin \pi f_x(s_1+\Delta s_1) + \quad (2)$$

$$t_2 \cos \pi f_x(\Delta d_2 + \Delta s_2)\sin \pi f_x(s_2 + \Delta s_2)] -$$

$$\frac{i}{\pi f_x}[t_1 \sin \pi f_x(\Delta d_1 - \Delta s_1)\sin \pi f_x(s_1+\Delta s_1) +$$

$$t_2 \sin \pi f_x(\Delta d_2 + \Delta s_2)\sin \pi f_x(s_2 + \Delta s_2)]$$

wherein $t_1$ is the transmittance for the first attenuated SRAF 630 corresponding to the first clear SRAF 610 and is a real number, $t_2$ is the transmittance for the second attenuated SRAF 640 corresponding to the second clear SRAF 620 and is a real number, and the SRAF total bias $\Delta s_1$ and $\Delta s_2$ may be described by as $a'-a=-\Delta s_1$ and $d'-d=\Delta s_2$. The real part of the refractive index of the absorber material may be selected to be similar to the refractive index of vacuum (the environment of EUV patterning device). For example, TaBN has an index of refraction of around 0.95, which is close to the refractive index of vacuum. So, with such a selection, it may be possible to ignore the phase accumulation through the absorber for the analysis.

Now, dummy variables $A_1$ (attenuation of attenuated SRAF 630, where $A_1=1-t_1$) and $A_2$ (attenuation of attenuated SRAF 640, here $A_2=1-t_2$) can be defined. Then a Taylor expansion can be performed on equation (2) and the main, first order and partial second order small items can be kept. Further, the real part of $T_m$ may be represented as $R_1$, the imaginary part of $T_m$ as $I_1$, the extra term in the real part of $T_m'$ as $R_2$, and the extra term in the imaginary part of $T_m'$ as $I_2$. Then $T_m'$ can be written as $$T_m' = R_1 + R_2 + i(I_1 + I_2) \quad (3)$$

and $$T_m = R_1 + iI_1 \quad (4)$$

wherein $$R_1 = \frac{\sin \pi w f_x}{\pi f_x} + \frac{1}{\pi f_x}[\cos(\pi f_x \Delta d_1)\sin(\pi f_x \Delta s_1) + \cos(\pi f_x \Delta d_2)\sin(\pi f_x s_2)] \quad (5)$$

$$R_2 = \frac{1}{\pi f_x}\begin{bmatrix} -A_1 \cos(\pi f_x \Delta d_1)\sin(\pi f_x s_1) + \\ \pi f_x \Delta s_1 \sin(\pi f_x \Delta d_1)\sin(\pi f_x s_1) + \\ \pi f_x \Delta s_1 \cos(\pi f_x \Delta d_1)\cos(\pi f_x s_1) - \\ A_2 \cos(\pi f_x \Delta d_2)\sin(\pi f_x s_2) - \\ \pi f_x \Delta s_2 \sin(\pi f_x \Delta d_2)\sin(\pi f_x s_2) + \\ \pi f_x \Delta s_2 \cos(\pi f_x \Delta d_2)\cos(\pi f_x s_2) - \\ A_1 \pi f_x \Delta s_1 \sin(\pi f_x \Delta d_1)\sin(\pi f_x s_1) - \\ A_1 \pi f_x \Delta s_1 \cos(\pi f_x \Delta d_1)\cos(\pi f_x s_1) + \\ A_2 \pi f_x \Delta s_2 \sin(\pi f_x \Delta d_2)\sin(\pi f_x s_2) - \\ A_2 \pi f_x \Delta s_2 \cos(\pi f_x \Delta d_2)\cos(\pi f_x s_2) \end{bmatrix} \quad (6)$$

$$I_1 = -\frac{1}{\pi f_x}[\sin(\pi f_x \Delta d_1)\sin(\pi f_x s_1) + \sin(\pi f_x \Delta d_2)\sin(\pi f_x s_2)] \quad (7)$$

and $$I_2 = -\frac{1}{\pi f_x}\begin{bmatrix} -A_1 \sin(\pi f_x \Delta d_1)\sin(\pi f_x s_1) + \\ \pi f_x \Delta s_1 \sin(\pi f_x \Delta d_1)\cos(\pi f_x s_1) - \\ \pi f_x \Delta s_1 \cos(\pi f_x \Delta d_1)\sin(\pi f_x s_1) - \\ A_2 \sin(\pi f_x \Delta d_2)\sin(\pi f_x s_2) + \\ \pi f_x \Delta s_2 \sin(\pi f_x \Delta d_2)\cos(\pi f_x s_2) + \\ \pi f_x \Delta s_2 \cos(\pi f_x \Delta d_2)\sin(\pi f_x s_2) - \\ A_1 \pi f_x \Delta s_1 \sin(\pi f_x \Delta d_1)\cos(\pi f_x s_1) + \\ A_1 \pi f_x \Delta s_1 \cos(\pi f_x \Delta d_1)\sin(\pi f_x s_1) - \\ A_2 \pi f_x \Delta s_2 \sin(\pi f_x \Delta d_2)\cos(\pi f_x s_2) - \\ A_2 \pi f_x \Delta s_2 \cos(\pi f_x \Delta d_2)\sin(\pi f_x s_2) \end{bmatrix} \quad (8)$$

The electric field at substrate level can then be approximated, for a clear SRAF, as:

$$t_m = F^{-1}\{P \cdot T_m\} = \int_{-\infty}^{+\infty} P \cdot T_m(f_x) \cdot e^{i2\pi f_x x} df_x = \int_{-f_c}^{f_c} T_m(f_x) \cdot e^{i2\pi f_x x} df_x \quad (9)$$

wherein P represents the pupil function, and $f_c$ represents a cut off frequency of the optical system.

So, method 500 may also contain an operation 506 in which an inverse Fourier transform is performed to formulate an aerial image for the patterning device, as described below. In particular, for a periodic line-space arrangement, the Fourier spectra may be discrete, and so the aerial image can be defined as:

$$t_m = \sum_{n=-n_c}^{n_c} T_m(f_n) \cdot e^{i2\pi f_n x} \quad (10)$$

where $n_c$ represents the cut off diffraction order for the optical system. Consequently, at the center of the aerial image, equation (10) may then reduce to:

$$t_m = \sum_{n=-n_c}^{n_c} T_m(f_n) \quad (11)$$

As described above, a EUV lithographic apparatus employs reflective optics and the beam of radiation incident on the reflective EUV patterning device has an oblique incident angle of the chief ray. So, for a EUV apparatus, the cutoff frequencies are determined by the numerical aperture of the projection optics and a central obscuration in such optics. And, thus, the spatial frequencies of diffraction orders collected by the projection optics should be within the range of:

$$\left[\frac{\sin(CRAO)}{\lambda} - \frac{NA}{Mag\lambda}, \frac{\sin(CRAO)}{\lambda} - \frac{0.2NA}{Mag\lambda}\right] \quad (12)$$

$$\bigcup \left[\frac{\sin(CRAO)}{\lambda} + \frac{0.2NA}{Mag\lambda}, \frac{\sin(CRAO)}{\lambda} + \frac{NA}{Mag\lambda}\right]$$

wherein Mag is the demagnification ratio, NA is the numerical aperture, λ is the radiation wavelength, and CRAO is the chief ray angle at object side of illumination incident on the patterning device. Method 500 may contain an operation 508, wherein maximum intensities of the aerial images for the first and second diffraction spectra are matched to arrive at a matching formulation that can be solved to obtain a dimension of the attenuated SRAF that will have matched performance to a clear SRAF.

To facilitate this matching, an example illumination can be selected and used to solve the equations. In this example, a y dipole form of radiation is selected wherein N and S represent the respective illumination poles of the pupil for purposes of derivation. So, to match the aerial image at the center location before and after attenuation, it is relevant to hold the total energy equal for the clear SRAF and the attenuated SRAF:

$$|t_{mN}|^2 + |t_{mS}|^2 = |t_{mN}'|^2 + |t_{mS}'|^2 \qquad (13)$$

wherein $t_{mN}$, $t_{mS}$, $t_{mN}'$, and $t_{mS}'$ may be represented by $$t_{mN} = \sum_{n=-n_cN}^{n_cN} R_1 + iI_1 = R_{1N} + iI_{1N} \qquad (14)$$

$$t_{mS} = \sum_{n=-n_cS}^{n_cS} R_1 + iI_1 = R_{1S} + iI_{1S} \qquad (15)$$

$$t_{mN}' = \sum_{n=-n_cN}^{n_cN} R_1 + R_2 + i(I_1 + I_2) = R_{1N} + R_{2N} + i(I_{1N} + I_{2N}) \qquad (16)$$

and $$t_{mS}' = \sum_{n=-n_cS}^{n_cS} R_1 + R_2 + i(I_1 + I_2) = R_{1S} + R_{2S} + i(I_{1S} + I_{2S}) \qquad (17)$$

By inserting equations (13)-(17) into equation (13), equation (13) may be rewritten as:

$$R_{2N}^2 + 2R_{1N}R_{2N} + I_{2N}^2 + 2I_{1N}I_{2N} + R_{2S}^2 + 2R_{1S}R_{2S} + I_{2S}^2 + 2I_{1S}I_{2S} = 0 \qquad (18)$$

If the second order small items are disregarded, equation (18) may reduce to:

$$R_{1N}R_{2N} + I_{1N}I_{2N} + R_{1S}R_{2S} + I_{1S}I_{2S} = 0 \qquad (19)$$

Method 500 also includes an operation 510 wherein the matching formulation is solved to arrive at one or more dimensions (e.g., width, position, etc.) of the attenuated SRAF. For example, the matching formulation can be solved to arrive at a width of one or more attenuated SRAFs in relation to the patterning device pattern layout. In embodiment, equation (18) or (19) can be solved to arrive at the one or more dimensions. Equation (18), (19) or other formulation can be solved with a specified attenuation or absorber thickness of the attenuated SRAF. Optionally, as described hereafter, the attenuation or absorber thickness of the attenuated SRAF can be determined and optionally optimized with determining the one or more dimensions of the one or more attenuated SRAFs. Once solved, the method can output an electronic data structure for use in creating a patterning device with a patterning device pattern layout having the attenuated SRAF with the dimension.

Equation (18) or (19) may not have an analytical solution, but may instead be solved numerically. A resolution to the question of solving for SRAF bias and attenuation may be found by setting F=0 where $F = R_{1N}R_{2N} + I_{1N}I_{2N} + R_{1S}R_{2S} + I_{1S}I_{2S}$. Further, if the N and S poles have mirror symmetry, then $R_{1N}=R_{1S}, R_{2N}=R_{2S}, I_{1N}=-I_{1S}, I_{2N}=-I_{2S}$ and equation (19) reduces to:

$$F = R_{1N}R_{2N} + I_{1N}I_{2N} = 0 \qquad (20)$$

The spatial frequencies of diffraction orders for the N pole are determined by:

$$f_x = \frac{n}{Mag \cdot p} + \frac{NA \cdot \sigma_c}{Mag \cdot \lambda} + \frac{\sin CRAO}{\lambda} \qquad (21)$$

The spatial frequencies of diffraction orders for the S pole are determined by:

$$f_x = \frac{n}{Mag \cdot p} - \frac{NA \cdot \sigma_c}{Mag \cdot \lambda} + \frac{\sin CRAO}{\lambda} \qquad (22)$$

wherein, in equations (21) and (22), n is the diffraction order, p is the pitch of the feature and $\sigma_c$ is the center sigma of the pupil.

Method 500 may also include an operation 512 by which the attenuated SRAF attenuation and/or absorber thickness can be determined in order to facilitate calculation of a dimension (such as width) of the attenuated SRAF using the matching formulation. The attenuated SRAF attenuation and/or absorber thickness may depend on an attenuated SRAF thickness so an optimization-type process (e.g., an iterative process) can used to arrive at a combination of attenuated SRAF attenuation and/or absorber thickness with one or more SRAF dimensions that is optimum, meets or crosses a threshold, etc. Example techniques for determining the attenuated SRAF attenuation and/or absorber thickness for input to a matching formulation and for determining a combination of attenuated SRAF attenuation and/or absorber thickness with one or more SRAF dimensions are described hereafter.

Referring back to the dipole illumination above, wherein two point sources with equal intensity are used to represent the N and S poles, equation (19) or (20) can be numerically solved to find SRAF bias for a given attenuation using the following relationship between absorber thickness and transmittance:

$$t = 1 - A = \exp(-2\alpha k_0 h) \qquad (23)$$

wherein α is the imaginary part of the refractive index of the absorber, $k_0 = 2\pi/\lambda$ and is the propagation constant, and h is the absorber thickness of the attenuated SRAF.

The absorber thickness h should be specially chosen. In an embodiment, it can be chosen using an iterative optimization-type process wherein the image log slope (e.g., NILS), the side lobe printing, and/or best focus center (desirably all three) are checked for a given thickness. If the results do not meet the criteria of, e.g., NILS (>1.5), side lobe, best focus shift (<10% of DOF), the calculation is repeated for a different thickness. Once an appropriate thickness is identified, the thickness, a corresponding attenuation value, etc. can then be used to solve for an attenuated SRAF dimension such as width.

FIG. 12 shows an example of this type of analysis. FIG. 13A schematically shows patterning device with the SRAF absorber thickness h shown along with the total absorber thickness H. From these two parameters, a SRAF absorber thickness fraction or percentage parameter in the form of h divided by H can be specified. This SRAF absorber thickness parameter is used in FIGS. 13B and 13C described below.

FIG. 13B shows an image log slope (in this NILS) as a function of the SRAF absorber thickness parameter and of a SRAF width. FIG. 13C shows side lobe printing (in terms of the side lobe energy minus the resist image threshold and thus a non-zero value means an unwanted side lobe being printed) also as a function of the SRAF absorber thickness parameter and of SRAF width. Having regard to FIGS. 13B and 13C, a thinner SRAF absorber thickness parameter and larger SRAF width leads to higher NILS, but also suffers from the side lobe printing issue. The dashed line 700 indicates the region where SRAF side lobe intensity minus resist print threshold is larger than zero; the region above the dashed line 700 indicates that there is side lobe printing. So, based on these results, a best solution can be found that balances the SRAF absorber thickness and SRAF width, and provides the highest possible NILS at a reasonably large SRAF width within the patterning device creating capability. The dot 710 represents an example best solution.

To apply this method to a full chip, a model based SRAF tuning using the principles above may be more effective and can comprise: optimizing the attenuated SRAF absorber thickness as the third tone (wherein the first tone is the reflective or transmissive part of the pattern layout and the second tone is the absorbing part of the pattern layout), then building a tri-tone mask 3D library, calculating the complex scattering coefficient using the library, and solving the inverse problem through a gradient based optimization method to obtain optimum SRAF position and/or shape and using a side lobe penalty to guard against side lobe printing. In an embodiment, this technique can be applied full chip or applied to a portion thereof.

In an embodiment, a rule based technique can be applied for SRAF selection across a full chip. In an embodiment, the rule based technique comprises the model based SRAF tuning as described above, generating one or more rules from the obtained SRAF position and/or shape, and then applying the one or more rules to the full chip to provide SRAFs to the full chip.

In an embodiment, a hybrid rule/model based approach can be used which comprising applying one or more rules to dictate the position and/or shape of an attenuated SRAF as an initial seeding and using a model based approach (such as the model based SRAF tuning described above) to further fine tune the position and/or shape of an attenuated SRAF from the initial seeding.

Optimizing attenuated assist feature placement and width offers a powerful knob to control Bossung tilt and adjust the best focus center. So, in an embodiment, the patterning device can be first optimized with a clear SRAF. Then, the attenuated SRAF absorber thickness can be optimized under the constraints of image log slope, side lobe and/or best focus shift. Then, the absorber thickness can be applied to the attenuated SRAF methods described above to arrive at one or more dimensions (e.g., width, placement, etc.) of the attenuated SRAF.

Further, the non-telecentricity of EUV optics on reticle side and mask 3D effect (namely the effect of the patterning device has features there on with a finite thickness rather than the infinitely thin mask of Kirchoff analysis) results in a tilted phase front and significant quadratic and asymmetric phase response for both small angle and large angle poles for a 1D horizontal line-space arrangement. Moreover, an extra phase term is accumulated when radiation travels through an absorber trench of SRAF compared to a main feature of a patterning device pattern, and accounts for a Bossung tilt that is observed. So, asymmetric SRAFs can be placed besides the main feature to correct the Bossung tilt and best focus shift (and increase DOF) caused by the phase error. Asymmetric SRAFs have one SRAF corresponding to a main feature being closer to a main feature side than another SRAF corresponding to the main feature is to another side of the main feature. Appropriate selection of asymmetric assist features can introduce extra phase among diffraction orders to balance the phase deviations caused by oblique incidence, mask 3D effect and/or an absorber trench of a SRAF.

While the discussion has focused above on an EUV application, the techniques herein can also applied to other radiation wavelengths, such as deep ultraviolet (e.g., in the range about 100-300 nm). Accordingly, the techniques herein can also be applied to a transmissive patterning device. For example, the absorbing feature of the attenuated SRAF can be an extra material in a space between absorbing pattern features (e.g. similar to the embodiments of FIGS. 9H and 9B, wherein the layer 403 and substrate 404 are transmissive). Or, the absorbing feature of the attenuated SRAF can be absorbing, but transmissive, pattern features such as assist features 406 in FIGS. 9G and 9O wherein the layer 403 and substrate 404 are transmissive and the absorber 407 is blocking while assist features 406 are at least partially transmissive (e.g., translucent, semitransparent, etc.). In a further transmissive embodiment, the absorbing feature of the attenuated SRAF can be incorporated into the body of layer 403 and/or substrate 404.

Further, the technique herein may be applied in a lithography system of any numerical aperture with a corresponding design of projection system. Also, the techniques herein are not limited to any particular shapes of patterning device. For example, in an embodiment, the techniques herein can be applied to an irregular (e.g., curvilinear) shape of mask. In an embodiment, the irregular shape relates to a cross-section of the patterning device, the cross-section extending in a direction perpendicular to radiation-receiving surface of the patterning device.

In an embodiment, there is provided a patterning device, comprising: an absorber layer on a patterning device substrate; and a reflective or transmissive layer on the patterning device substrate, wherein the absorber layer and the reflective or transmissive layer together define a pattern layout having a main feature and an attenuated sub-resolution assist feature (attenuated SRAF) paired with the main feature, wherein: the main feature is configured to generate, upon transferring the device pattern to a layer of patterning material on a substrate, the main feature in the layer of patterning material, and upon the transferring the pattern to the layer of patterning material, the attenuated SRAF is configured to avoid generating a feature in the layer of patterning material and to produce a different radiation intensity than the main feature.

In an embodiment, the attenuated SRAF has absorbing material with a height or depth that is lower than that of the absorber layer defining at least in part the main feature. In an embodiment, the attenuated SRAF is a first distance from a first side of the main feature, and a further attenuated SRAF paired with the main feature, is a second distance from a second side of the main feature, wherein the first distance is different from the second distance. In an embodiment, the attenuated SRAF has a first width, and a further attenuated SRAF paired with the main feature has a second width, wherein the first width is different from the second width. In an embodiment, the attenuated SRAF has a first height above a surface of the patterning device or a first depth into the absorber layer, and a further attenuated SRAF paired with the main feature has a corresponding second height above the surface of the patterning device or a second depth into the absorber layer, wherein the first height or depth is different from the second height or depth. In an embodiment, the patterning device is reflective and comprises the reflective layer on the patterning device substrate. In an embodiment, the absorber layer is a metal layer. In an embodiment, the absorber layer comprises one or more selected from: nickel, chrome, aluminum, ruthenium, rhenium, and/or gold. In an embodiment, the absorber layer comprises a metal nitride. In an embodiment, the absorber layer comprises tantalum boron nitride (TaBN). In an embodiment, the patterning device is a dark-field patterning device. In an embodiment, the patterning device is a bright-field patterning device. In an embodiment, the patterning layout comprises a device pattern layout and the patterning device is configured to reflect extreme ultraviolet radiation.

In an embodiment, there is provided a patterning device, comprising: a patterning device substrate; and a patterning layer on the substrate, wherein: a first portion of the patterning layer has a first level of reflectance, absorbance or transmission, a second portion of the patterning layer has a second level of reflectance, absorbance or transmission different than the first level of reflectance, absorbance or transmission, and a third portion of the patterning layer has a third level of reflectance, absorbance or transmission, wherein third level of reflectance, absorbance or transmission is between the first and second levels of reflectance, absorbance or transmission and is part of a sub-resolution assist feature.

In an embodiment, the patterning layer comprising an absorber layer and a reflective layer, and the first portion of the patterning layer comprises at least part of the absorber layer and the second portion of the patterning layer comprises at least part of the reflective layer. In an embodiment, the third level of reflectance, absorbance or transmission is associated with a thickness of an absorbing material on the patterning device substrate. In an embodiment, the patterning layer comprises an absorber, and wherein the first portion has a first thickness of absorber material, the second portion has a second thickness of absorber material, and the third portion has a third thickness of absorber material, wherein the first thickness is greater than the second thickness, and wherein the second thickness is greater than the third thickness. In an embodiment, the third portion has a greater absorbance than the first portion, wherein the first portion is an absorber and the second portion is a reflective surface. In an embodiment, the patterning layer comprises a device pattern layout and the patterning device is configured to reflect extreme ultraviolet radiation.

In an embodiment, there is provided a method of making a patterning device, the method comprising: removing, from an absorber layer over a patterning device substrate of the patterning device, a portion of absorber material to form a first set of pattern layout features and a second set of pattern layout features; providing a masking material on at least part of the second set of pattern layout features so as to expose the first set of pattern layout features while covering the second set of pattern layout features; and removing at least of part of the absorbing layer for the first set of pattern layout features while the second set of pattern layout features are covered by the masking material.

In an embodiment, wherein the first set of mask features includes a main feature of a device pattern layout and wherein the removing comprises exposing a reflective or transmissive surface of the patterning device substrate. In an embodiment, the second set of mask features includes a sub-resolution assist feature and the sub-resolution feature has a non-zero thickness of absorbing material. In an embodiment, the patterning device corresponds to a dark field patterning device. In an embodiment, the first set of mask features includes a sub-resolution assist feature. In an embodiment, the first set of mask features protrude from the patterning device substrate and the removing comprises reducing a height or thickness of the first set of mask features. In an embodiment, the patterning device corresponds to a bright field patterning device. In an embodiment, the patterning device is reflective and configured to reflect extreme ultraviolet radiation.

In an embodiment, there is provided a method of making a patterning device, the method comprising: removing, from an absorber layer over a patterning device substrate of the patterning device, a portion of absorber material to form a set of pattern layout features; providing a masking material on at least part of the set of pattern layout features so as to expose a portion of the patterning device substrate while covering the set of pattern layout features; and adding an absorbing material to the exposed portion of the patterning device substrate while the set of pattern layout features are covered by the masking material.

In an embodiment, the adding comprises physical or chemical vapor deposition. In an embodiment, the set of mask features includes a main feature of a device pattern layout and wherein the adding comprises adding an absorbing material to a reflective surface of the patterning device substrate. In an embodiment, the exposed portion corresponds to a sub-resolution assist feature of a device pattern layout and the adding comprises forming the sub-resolution feature with a non-zero thickness of absorbing material. In an embodiment, the patterning device corresponds to a dark field patterning device. In an embodiment, the set of mask features includes a sub-resolution assist feature. In an embodiment, the set of mask features protrude from the patterning device substrate and the adding comprises forming a main feature of a device pattern layout. In an embodiment, the patterning device corresponds to a bright field patterning device. In an embodiment, the patterning device is reflective and configured to reflect extreme ultraviolet radiation.

In an embodiment, there is provided a method comprising: obtaining a matching formulation that matches a maximum aerial image intensity of a first diffraction spectrum associated with a patterning device pattern layout having a clear sub-resolution feature (clear SRAF) with a maximum aerial image intensity of a second diffraction spectrum associated with the patterning device pattern layout modified to have an attenuated sub-resolution feature (attenuated SRAF); and solving, by a hardware computer, the matching formulation to determine a value of a dimension of the attenuated SRAF.

In an embodiment, the method further comprises determining an attenuation value and/or absorber thickness for the attenuated SRAF for use in solving the matching formulation. In an embodiment, the determining comprises iteratively evaluating a plurality of attenuation values and/or absorber thicknesses against a threshold for image log slope, side lobe printing and/or best focus center. In an embodiment, the dimension is a width of the attenuated SRAF. In an embodiment, the dimension comprises a distance of an attenuated SRAF from a main feature and the determining comprises: determining, by the hardware computer, a first distance of a first attenuated SRAF from a main feature of the patterning device pattern layout, and determining, by the hardware computer, a second distance of a second attenuated SRAF from the main feature. In an embodiment, the first distance is different from the second distance. In an embodiment, the method further comprises: creating a formulation for the first diffraction spectrum; creating a formulation for the second diffraction spectrum; and performing, by the hardware computer, an inverse Fourier transform to obtain the aerial images. In an embodiment, the method further comprises outputting an electronic data structure for use in creating a patterning device with a patterning device pattern layout having the attenuated SRAF with the dimension. In an embodiment, the patterning device pattern layout is configured for a patterning device to reflect extreme ultra-violet radiation. In an embodiment, the method further comprises: optimizing an absorber thickness of the attenuated SRAF as a third tone, wherein the first tone is the reflective or transmissive part of the pattern layout and the second tone is the absorbing part of the pattern layout; building a tri-tone mask 3D library; calculating a complex scattering coefficient based on the library; and optimizing the attenuated SRAF position and/or shape using the complex scattering coefficient and using a side lobe penalty to guard against undesired side lobe printing. In an embodiment, the method further comprises: generating one or more rules from the obtained SRAF position and/or shape; and applying the one or more rules to a full chip pattern layout chip to place SRAFs in the full chip pattern layout. In an embodiment, the method further comprises: applying one or more rules to dictate the position and/or shape of an attenuated SRAF rules as an initial seeding; and using a model to fine tune the position and/or shape of an attenuated SRAF from the initial seeding.

As will be appreciated by one of ordinary skill in the art, the present techniques herein may be embodied as a system, method, or computer program product. Accordingly, aspects of the present application may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present application may take the form of a computer program product embodied in any one or more computer readable medium(s) having computer usable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, device, or any suitable combination of the foregoing. More specific examples (a non-exhaustive list) of the computer readable medium would include the following: an electrical connection having one or more wires, a portable computer diskette, a hard disk, a random access memory (RAM), a read-only memory (ROM), an erasable programmable read-only memory (e.g. EPROM or Flash memory), an optical fiber, a portable compact disc read-only memory CDROM, an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in a baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Computer code embodied on a computer readable medium may be transmitted using any appropriate medium, including but not limited to wireless, wireline, optical fiber cable, radio frequency RF, etc., or any suitable combination thereof.

Computer program code for carrying out operations for aspects of the present application may be written in any combination of one or more programming languages, including an object oriented programming language such as Java™, Smalltalk™, C++, or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network LAN or a wide area network WAN, or the connection may be made to an external computer (for example, through the Internet using an Internet Service Provider).

The computer program instructions may also be loaded onto a computer, other programmable data processing apparatus, or other devices to cause a series of operational steps to be performed on the computer, other programmable apparatus, or other devices to produce a computer implemented process such that the instructions which execute on the computer or other programmable apparatus provide processes for implementing one or more of the functions/acts specified herein.

As noted above, it should be appreciated that the illustrative embodiments may take the form of an entirely hardware embodiment, an entirely software embodiment or an embodiment containing both hardware and software elements. In one example embodiment, the mechanisms of the illustrative embodiments may be implemented in software or program code, which includes but is not limited to firmware, resident software, microcode, etc.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems and Ethernet cards are just a few of the currently available types of network adapters.

Figure 13:
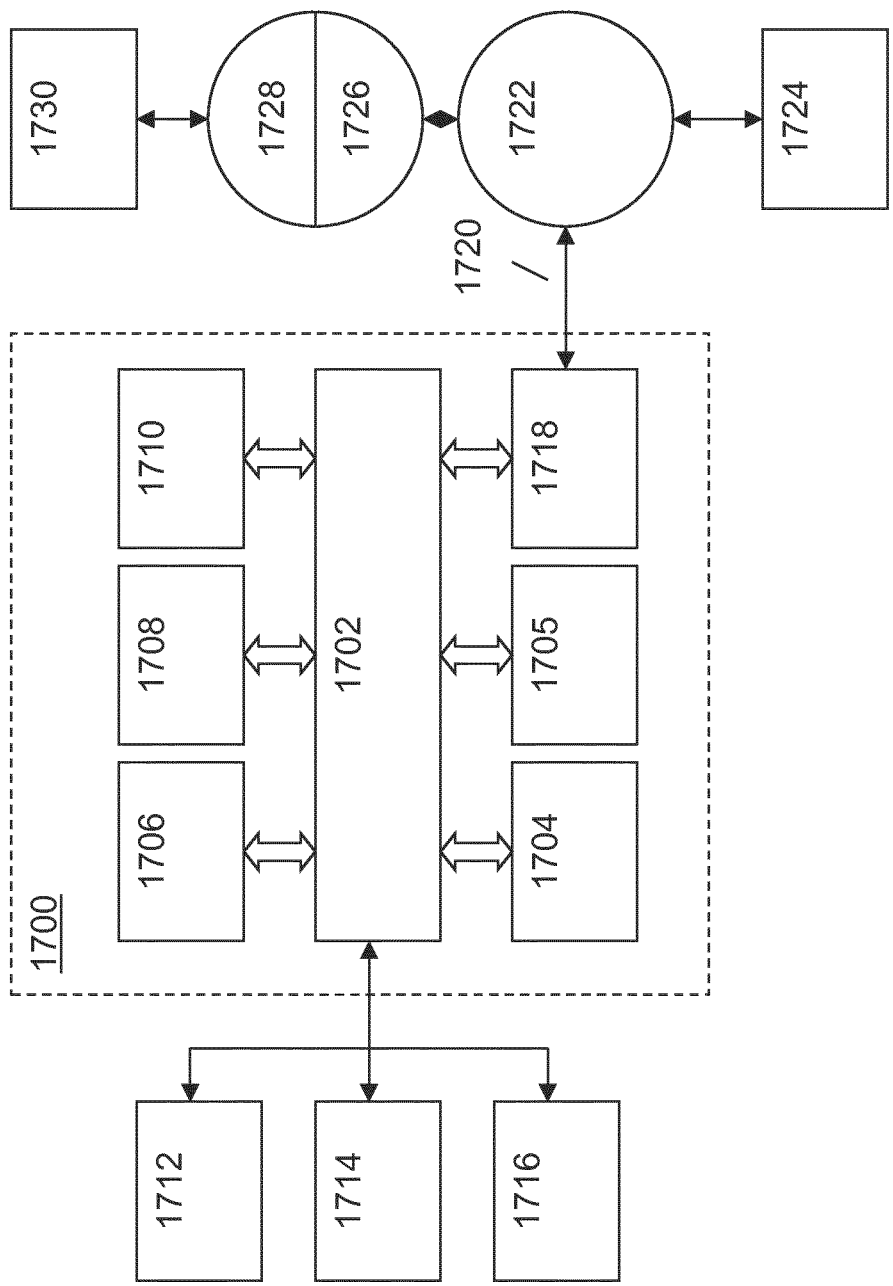
FIG. 13 depicts a schematic diagram of a computer system for use with one or more techniques described herein.

FIG. 13 shows a block diagram that illustrates an embodiment of a computer system 1700 which can assist in implementing any of the methods and flows disclosed herein. Computer system 1700 includes a bus 1702 or other communication mechanism for communicating information, and a processor 1704 (or multiple processors 1704 and 1705) coupled with bus 1702 for processing information. Computer system 1700 also includes a main memory 1706, such as a random access memory RAM or other dynamic storage device, coupled to bus 1702 for storing information and instructions to be executed by processor 1704. Main memory 1806 also may be used for storing temporary variables or other intermediate information during execution of instructions to be executed by processor 1704. Computer system 1700 further includes a read only memory ROM 1708 or other static storage device coupled to bus 1702 for storing static information and instructions for processor 1704. A storage device 1710, such as a magnetic disk or optical disk, is provided and coupled to bus 1702 for storing information and instructions.

Computer system 1700 may be coupled via bus 1702 to a display 1712, such as a cathode ray tube (CRT) or flat panel or touch panel display for displaying information to a computer user. An input device 1714, including alphanumeric and other keys, is coupled to bus 1702 for communicating information and command selections to processor 1704. Another type of user input device is cursor control 1716, such as a mouse, a trackball, or cursor direction keys for communicating direction information and command selections to processor 1704 and for controlling cursor movement on display 1712. This input device typically has two degrees of freedom in two axes, a first axis (e.g. x) and a second axis (e.g. y), that allows the device to specify positions in a plane. A touch panel (screen) display may also be used as an input device.

According to one embodiment, portions of a process described herein may be performed by computer system 1700 in response to processor 1704 executing one or more sequences of one or more instructions contained in main memory 1706. Such instructions may be read into main memory 1706 from another computer-readable medium, such as storage device 1710. Execution of the sequences of instructions contained in main memory 1706 causes processor 1704 to perform the process steps described herein. One or more processors in a multi-processing arrangement may also be employed to execute the sequences of instructions contained in main memory 1706. In an alternative embodiment, hard-wired circuitry may be used in place of or in combination with software instructions. Thus, the description herein is not limited to any specific combination of hardware circuitry and software.

The term "computer-readable medium" as used herein refers to any medium that participates in providing instructions to processor 1704 for execution. Such a medium may take many forms, including but not limited to, non-volatile media, volatile media, and transmission media. Non-volatile media include, for example, optical or magnetic disks, such as storage device 1710. Volatile media include dynamic memory, such as main memory 1706. Transmission media include coaxial cables, copper wire and fiber optics, including the wires that comprise bus 1702. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1704 for execution. For example, the instructions may initially be borne on a magnetic disk of a remote computer. The remote computer can load the instructions into its dynamic memory and send the instructions over a telephone line using a modem. A modem local to computer system 1700 can receive the data on the telephone line and use an infrared transmitter to convert the data to an infrared signal. An infrared detector coupled to bus 1702 can receive the data carried in the infrared signal and place the data on bus 1702. Bus 1702 carries the data to main memory 1706, from which processor 1704 retrieves and executes the instructions. The instructions received by main memory 1706 may optionally be stored on storage device 1710 either before or after execution by processor 1704.

Computer system 1700 may also include a communication interface 1718 coupled to bus 1702. Communication interface 1718 provides a two-way data communication coupling to a network link 1720 that is connected to a local network 1722. For example, communication interface 1718 may be an integrated services digital network ISDN card or a modem to provide a data communication connection to a corresponding type of telephone line. As another example, communication interface 1718 may be a local area network LAN card to provide a data communication connection to a compatible LAN. Wireless links may also be implemented. In any such implementation, communication interface 1718 sends and receives electrical, electromagnetic or optical signals that carry digital data streams representing various types of information.

Network link 1720 typically provides data communication through one or more networks to other data devices. For example, network link 1720 may provide a connection through local network 1722 to a host computer 1724 or to data equipment operated by an Internet Service Provider ISP 1726. ISP 1726 in turn provides data communication services through the worldwide packet data communication network, now commonly referred to as the "Internet" 1728. Local network 1722 and Internet 1728 both use electrical, electromagnetic or optical signals that carry digital data streams. The signals through the various networks and the signals on network link 1720 and through communication interface 1718, which carry the digital data to and from computer system 1700, are exemplary forms of carrier waves transporting the information.

Computer system 1700 can send messages and receive data, including program code, through the network(s), network link 1720, and communication interface 1718. In the Internet example, a server 1730 might transmit a requested code for an application program through Internet 1728, ISP 1726, local network 1722 and communication interface 1718. One such downloaded application may provide for a method or portion thereof as described herein, for example. The received code may be executed by processor 1704 as it is received, and/or stored in storage device 1710, or other non-volatile storage for later execution. In this manner, computer system 1700 may obtain application code in the form of a carrier wave.

The embodiments may further be described using the following clauses:

1. A patterning device, comprising:
   an absorber layer on a patterning device substrate; and
   a reflective or transmissive layer on the patterning device substrate,
   wherein the absorber layer and the reflective or transmissive layer together define a pattern layout having a main feature and an attenuated sub-resolution assist feature (attenuated SRAF) paired with the main feature, wherein:
   the main feature is configured to generate, upon transferring the device pattern to a layer of patterning material on a substrate, the main feature in the layer of patterning material, and
   upon the transferring the pattern to the layer of patterning material, the attenuated SRAF is configured to avoid generating a feature in the layer of patterning material and to produce a different radiation intensity than the main feature.
2. The device of clause 1, wherein the attenuated SRAF has absorbing material with a height or depth that is lower than that of the absorber layer defining at least in part the main feature.
3. The device of clause 1 or clause 2, wherein the attenuated SRAF is a first distance from a first side of the main feature, and a further attenuated SRAF paired with the main feature, is a second distance from a second side of the main feature, wherein the first distance is different from the second distance.
4. The device of any of clauses 1-3, wherein the attenuated SRAF has a first width, and a further attenuated SRAF paired with the main feature has a second width, wherein the first width is different from the second width.
5. The device of any of clauses 1-4, wherein the attenuated SRAF has a first height above a surface of the patterning device or a first depth into the absorber layer, and a further attenuated SRAF paired with the main feature has a corresponding second height above the surface of the patterning device or a second depth into the absorber layer, wherein the first height or depth is different from the second height or depth.
6. The device of any of clauses 1-5, being reflective and comprising the reflective layer on the patterning device substrate.
7. The device of any of clauses 1-6, wherein the absorber layer is a metal layer.
8. The device of any of clauses 1-7, wherein the absorber layer comprises one or more selected from: nickel, chrome, aluminum, ruthenium, rhenium, and/or gold.
9. The device of any of clauses 1-7, wherein the absorber layer comprises a metal nitride.
10. The device of clause 9, wherein the absorber layer comprises tantalum boron nitride (TaBN).
11. The device of any of clauses 1-10, wherein the patterning device is a dark-field patterning device.
12. The device of any of clauses 1-10, wherein the patterning device is a bright-field patterning device.
13. The device of any of clauses 1-12, wherein the patterning layout comprises a device pattern layout and the patterning device is configured to reflect extreme ultraviolet radiation.
14. A patterning device, comprising:
   a patterning device substrate; and
   a patterning layer on the substrate, wherein:
   a first portion of the patterning layer has a first level of reflectance, absorbance or transmission,
   a second portion of the patterning layer has a second level of reflectance, absorbance or transmission different than the first level of reflectance, absorbance or transmission, and
   a third portion of the patterning layer has a third level of reflectance, absorbance or transmission, wherein third level of reflectance, absorbance or transmission is between the first and second levels of reflectance, absorbance or transmission and is part of a sub-resolution assist feature.
15. The device of clause 14, wherein the patterning layer comprising an absorber layer and a reflective layer, and the first portion of the patterning layer comprises at least part of the absorber layer and the second portion of the patterning layer comprises at least part of the reflective layer.
16. The device of clause 14 or clause 15, wherein the third level of reflectance, absorbance or transmission is associated with a thickness of an absorbing material on the patterning device substrate.
17. The device of any of clauses 14-16, wherein the patterning layer comprises an absorber, and wherein the first portion has a first thickness of absorber material, the second portion has a second thickness of absorber material, and the third portion has a third thickness of absorber material, wherein the first thickness is greater than the second thickness, and wherein the second thickness is greater than the third thickness.
18. The device of any of clauses 14-17, wherein the third portion has a greater absorbance than the first portion, wherein the first portion is an absorber and the second portion is a reflective surface.
19. The device of any of clauses 14-18, wherein the patterning layer comprises a device pattern layout and the patterning device is configured to reflect extreme ultraviolet radiation.
20. A method of making a patterning device, the method comprising:
   removing, from an absorber layer over a patterning device substrate of the patterning device, a portion of absorber material to form a first set of pattern layout features and a second set of pattern layout features;
   providing a masking material on at least part of the second set of pattern layout features so as to expose the first set of pattern layout features while covering the second set of pattern layout features; and
   removing at least of part of the absorbing layer for the first set of pattern layout features while the second set of pattern layout features are covered by the masking material.
21. The method of clause 20, wherein the first set of mask features includes a main feature of a device pattern layout and wherein the removing comprises exposing a reflective or transmissive surface of the patterning device substrate.
22. The method of clause 21, wherein the second set of mask features includes a sub-resolution assist feature and the sub-resolution feature has a non-zero thickness of absorbing material.
23. The method of any of clauses 20-22, wherein the patterning device corresponds to a dark field patterning device.
24. The method of clause 20, wherein the first set of mask features includes a sub-resolution assist feature.

25. The method of clause 24, wherein the first set of mask features protrude from the patterning device substrate and the removing comprises reducing a height or thickness of the first set of mask features.

26. The method of clause 24 or clause 25, wherein the patterning device corresponds to a bright field patterning device.

27. The method of any of clauses 20-26, wherein the patterning device is reflective and configured to reflect extreme ultraviolet radiation.

28. A method of making a patterning device, the method comprising:
    removing, from an absorber layer over a patterning device substrate of the patterning device, a portion of absorber material to form a set of pattern layout features;
    providing a masking material on at least part of the set of pattern layout features so as to expose a portion of the patterning device substrate while covering the set of pattern layout features; and
    adding an absorbing material to the exposed portion of the patterning device substrate while the set of pattern layout features are covered by the masking material.

29. The method of clause 28, wherein the adding comprises physical or chemical vapor deposition.

30. The method of clause 28 or clause 29, wherein the set of mask features includes a main feature of a device pattern layout and wherein the adding comprises adding an absorbing material to a reflective surface of the patterning device substrate.

31. The method of clause 30, wherein the exposed portion corresponds to a sub-resolution assist feature of a device pattern layout and the adding comprises forming the sub-resolution feature with a non-zero thickness of absorbing material.

32. The method of any of clauses 28-31, wherein the patterning device corresponds to a dark field patterning device.

33. The method of clause 28, wherein the set of mask features includes a sub-resolution assist feature.

34. The method of clause 33, wherein the set of mask features protrude from the patterning device substrate and the adding comprises forming a main feature of a device pattern layout.

35. The method of clause 33 or clause 34, wherein the patterning device corresponds to a bright field patterning device.

36. The method of any of clauses 28-35, wherein the patterning device is reflective and configured to reflect extreme ultraviolet radiation 37. A method, comprising:
    obtaining a matching formulation that matches a maximum aerial image intensity of a first diffraction spectrum associated with a patterning device pattern layout having a clear sub-resolution feature (clear SRAF) with a maximum aerial image intensity of a second diffraction spectrum associated with the patterning device pattern layout modified to have an attenuated sub-resolution feature (attenuated SRAF); and
    solving, by a hardware computer, the matching formulation to determine a value of a dimension of the attenuated SRAF.

38. The method of clause 37, further comprising determining an attenuation value and/or absorber thickness for the attenuated SRAF for use in solving the matching formulation.

39. The method of clause 38, wherein the determining comprises iteratively evaluating a plurality of attenuation values and/or absorber thicknesses against a threshold for image log slope, side lobe printing and/or best focus center.

40. The method of any of clauses 37-39, wherein the dimension is a width of the attenuated SRAF.

41. The method of any of clauses 37-40, wherein the dimension comprises a distance of an attenuated SRAF from a main feature and the determining comprises:
    determining, by the hardware computer, a first distance of a first attenuated SRAF from a main feature of the patterning device pattern layout, and
    determining, by the hardware computer, a second distance of a second attenuated SRAF from the main feature.

42. The method of clause 41, wherein the first distance is different from the second distance.

43. The method of any of clauses 37-42, further comprising:
    creating a formulation for the first diffraction spectrum;
    creating a formulation for the second diffraction spectrum; and
    performing, by the hardware computer, an inverse Fourier transform to obtain the aerial images.

44. The method of any of clauses 37-43, further comprising outputting an electronic data structure for use in creating a patterning device with a patterning device pattern layout having the attenuated SRAF with the dimension.

45. The method of any of clauses 37-44, wherein the patterning device pattern layout is configured for a patterning device to reflect extreme ultraviolet radiation.

46. The method of any of clauses 37-45, further comprising:
    designing an absorber thickness of the attenuated SRAF as a third tone, wherein the first tone is the reflective or transmissive part of the pattern layout and the second tone is the absorbing part of the pattern layout;
    building a tri-tone mask 3D library;
    calculating a complex scattering coefficient based on the library; and
    configuring the attenuated SRAF position and/or shape using the complex scattering coefficient and using a side lobe penalty to guard against undesired side lobe printing.

47. The method of clause 46, further comprising:
    generating one or more rules from the obtained SRAF position and/or shape; and
    applying the one or more rules to a full chip pattern layout chip to place SRAFs in the full chip pattern layout.

48. The method of 37-47, further comprising:
    applying one or more rules to dictate the position and/or shape of an attenuated SRAF rules as an initial seeding; and
    using a model to fine tune the position and/or shape of an attenuated SRAF from the initial seeding.

49. A computer program product comprising a computer readable medium having instructions recorded thereon, the instructions when executed by a computer implementing the method of any of clauses 20-48.

In an embodiment, the attenuated SRAF is configured to have attenuation values that are evaluated against a threshold for image log slope, side lobe printing and/or best focus center. In an embodiment, the transferring the device pattern comprises exposing a reflective or transmissive layer or the patterning device substrate.

Although specific reference may be made in this text to the manufacture of ICs, it should be explicitly understood that the description herein has many other possible applications. For example, it may be employed in the manufacture of integrated optical systems, guidance and detection patterns for magnetic domain memories, liquid crystal display panels, thin film magnetic heads, etc. The skilled artisan will appreciate that, in the context of such alternative applications, any use of the terms "reticle"/"mask", "wafer" or "die" in this text should be considered as interchangeable with the more general terms "patterning device", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "optimizing" and "optimization" as used herein refers to or means adjusting a patterning process apparatus (e.g., patterning device), a patterning process, etc. such that results and/or processes of lithography or patterning processing have more a desirable characteristic, such as higher accuracy of projection of a design layout on a substrate, a larger process window, etc. Thus, the term "optimizing" and "optimization" as used herein refers to or means a process that identifies one or more values for one or more variables that provide an improvement, e.g. a local optimum, in at least one relevant metric, compared to an initial set of one or more values for those one or more variables. "Optimum" and other related terms should be construed accordingly. In an embodiment, optimization steps can be applied iteratively to provide further improvements in one or more metrics.

In an optimization process of a system, a figure of merit of the system or process can be represented as a cost function. The optimization process boils down to a process of finding a set of parameters (design variables) of the system or process that optimizes (e.g., minimizes or maximizes) the cost function. The cost function can have any suitable form depending on the goal of the optimization. For example, the cost function can be weighted root mean square (RMS) of deviations of certain characteristics (evaluation points) of the system or process with respect to the intended values (e.g., ideal values) of these characteristics; the cost function can also be the maximum of these deviations (i.e., worst deviation). The term "evaluation points" herein should be interpreted broadly to include any characteristics of the system or process. The design variables of the system can be confined to finite ranges and/or be interdependent due to practicalities of implementations of the system or process. In the case of a lithographic apparatus or patterning process, the constraints are often associated with physical properties and characteristics of the hardware such as tunable ranges, and/or patterning device manufacturability design rules, and the evaluation points can include physical points on a resist image on a substrate, as well as non-physical characteristics such as dose and focus.

While the concepts disclosed herein may be used with systems and methods for imaging on a substrate such as a silicon wafer, it shall be understood that the disclosed concepts may be used with any type of lithographic systems, e.g., those used for imaging on substrates other than silicon wafers.

In block diagrams, illustrated components are depicted as discrete functional blocks, but embodiments are not limited to systems in which the functionality described herein is organized as illustrated. The functionality provided by each of the components may be provided by software or hardware modules that are differently organized than is presently depicted, for example such software or hardware may be intermingled, conjoined, replicated, broken up, distributed (e.g. within a data center or geographically), or otherwise differently organized. The functionality described herein may be provided by one or more processors of one or more computers executing code stored on a tangible, non-transitory, machine readable medium. In some cases, third party content delivery networks may host some or all of the information conveyed over networks, in which case, to the extent information (e.g., content) is said to be supplied or otherwise provided, the information may be provided by sending instructions to retrieve that information from a content delivery network.

Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

The reader should appreciate that the present application describes several inventions. Rather than separating those inventions into multiple isolated patent applications, applicants have grouped these inventions into a single document because their related subject matter lends itself to economies in the application process. But the distinct advantages and aspects of such inventions should not be conflated. In some cases, embodiments address all of the deficiencies noted herein, but it should be understood that the inventions are independently useful, and some embodiments address only a subset of such problems or offer other, unmentioned benefits that will be apparent to those of skill in the art reviewing the present disclosure. Due to costs constraints, some inventions disclosed herein may not be presently claimed and may be claimed in later filings, such as continuation applications or by amending the present claims. Similarly, due to space constraints, neither the Abstract nor the Summary of the Invention sections of the present document should be taken as containing a comprehensive listing of all such inventions or all aspects of such inventions.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the"

include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The description of the present application has been presented for purposes of illustration and description, and is not intended to be exhaustive or limiting of the invention in the form disclosed. Many modifications and variations will be apparent to those of ordinary skill in the art. Thus, it will be apparent to one skilled in the art that modifications may be made as described without departing from the scope of the claims set out below.

What is claimed is:

1. A patterning device, comprising:
   an absorber layer on a patterning device substrate; and
   a reflective or transmissive layer on the patterning device substrate,
   wherein the absorber layer and the reflective or transmissive layer together define a pattern layout having a main feature; and
   an attenuated sub-resolution assist feature (attenuated SRAF) paired with the main feature, wherein:
      the main feature is configured to generate, upon transferring the device pattern to a layer of patterning material on a substrate, the main feature in the layer of patterning material, and
      upon the transferring the pattern to the layer of patterning material, the attenuated SRAF is configured to avoid generating a feature in the layer of patterning material and to produce a different radiation intensity than the main feature,
      wherein the attenuated SRAF is a first distance from a first side of the main feature, and a further attenuated SRAF paired with the main feature, is a second distance from a second side of the main feature, wherein the first distance is different from the second distance.

2. The device of claim 1, wherein the attenuated SRAF has absorbing material with a height or depth that is lower than that of the absorber layer defining at least in part the main feature.

3. The device of claim 1, wherein the attenuated SRAF has a first width, and a further attenuated SRAF paired with the main feature has a second width, wherein the first width is different from the second width.

4. The device of claim 1, wherein the attenuated SRAF has a first height above a surface of the patterning device or a first depth into the absorber layer, and a further attenuated SRAF paired with the main feature has a corresponding second height above the surface of the patterning device or a second depth into the absorber layer, wherein the first height or depth is different from the second height or depth.

5. The device of claim 1, being reflective and comprising the reflective layer on the patterning device substrate.

6. The device of claim 1, wherein the absorber layer is a metal layer.

7. The device of claim 1, wherein the absorber layer comprises one or more selected from: nickel, chrome, aluminum, ruthenium, rhenium, and/or gold.

8. The device of claim 1, wherein the absorber layer comprises a metal nitride.

9. The device of claim 8, wherein the absorber layer comprises tantalum boron nitride (TaBN).

10. The device of claim 1, wherein the patterning device is a dark-field patterning device.

11. The device of claim 1, wherein the patterning device is a bright-field patterning device.

12. The device of claim 1, wherein the pattern layout comprises a device pattern layout and the patterning device is configured to reflect extreme ultraviolet radiation.

13. A patterning device, comprising:
   a patterning device substrate; and
   a patterning layer on the substrate, wherein:
      a first portion of the patterning layer has a first level of reflectance, absorbance or transmission,
      a second portion of the patterning layer has a second level of reflectance, absorbance or transmission different than the first level of reflectance, absorbance or transmission, and
      a third portion of the patterning layer has a third level of reflectance, absorbance or transmission, wherein the third level of reflectance, absorbance or transmission is between the first and second levels of reflectance, absorbance or transmission and is part of a sub-resolution assist feature,
      wherein the sub-resolution assist feature is paired with a main feature at the first portion or second portion, the sub-resolution assist feature has a first width extending in a direction of elongation of the patterning layer, and a further sub-resolution assist feature is paired with the main feature has a second width extending in the direction of elongation of the patterning layer, wherein the first width is different from the second width.

14. The device of claim 13, wherein the patterning layer comprising an absorber layer and a reflective layer, and the first portion of the patterning layer comprises at least part of the absorber layer and the second portion of the patterning layer comprises at least part of the reflective layer.

15. The device of claim 13, wherein the third level of reflectance, absorbance or transmission is associated with a thickness of an absorbing material on the patterning device substrate.

16. The device of claim 13, wherein the patterning layer comprises an absorber, and wherein the first portion has a first thickness of absorber material, the second portion has a second thickness of absorber material, and the third portion has a third thickness of absorber material, wherein the first thickness is greater than the second thickness, and wherein the second thickness is greater than the third thickness.

17. The device of claim 13, wherein the third portion has a greater absorbance than the first portion, wherein the first portion is an absorber and the second portion is a reflective surface.

18. The device of claim 13, wherein the patterning layer comprises a device pattern layout and the patterning device is configured to reflect extreme ultraviolet radiation.

19. A patterning device, comprising:
an absorber layer on a patterning device substrate; and
a reflective or transmissive layer on the patterning device substrate,
wherein the absorber layer and the reflective or transmissive layer together define a pattern layout having a main feature; and
an attenuated sub-resolution assist feature (attenuated SRAF) paired with the main feature, wherein:
the main feature is configured to generate, upon transferring the device pattern to a layer of patterning material on a substrate, the main feature in the layer of patterning material, and
upon the transferring the pattern to the layer of patterning material, the attenuated SRAF is configured to avoid generating a feature in the layer of patterning material and to produce a different radiation intensity than the main feature,
wherein the attenuated SRAF has a difference in reflectance, absorbance or transmission from the main feature due at least in part to a difference in material composition of the structure used to form the attenuated SRAF from the structure used to form the main feature.

* * * * *